(12) United States Patent
Tian et al.

(10) Patent No.: US 12,326,477 B2
(45) Date of Patent: Jun. 10, 2025

(54) METHOD AND SYSTEM FOR MONITORING BATTERY SHORT CIRCUIT AND APPARATUS

(71) Applicant: NIO CO., LTD., Shanghai (CN)

(72) Inventors: Weichao Tian, Shanghai (CN); Lei Ye, Shanghai (CN); Zerun Zhou, Shanghai (CN); Hang Yin, Shanghai (CN); Xiang Chen, Shanghai (CN); Xinchun Lv, Shanghai (CN)

(73) Assignee: NIO CO., LTD., Shanghai (CN)

( * ) Notice: Subject to any disclaimer, the term of this patent is extended or adjusted under 35 U.S.C. 154(b) by 379 days.

(21) Appl. No.: 17/801,755

(22) PCT Filed: Dec. 11, 2020

(86) PCT No.: PCT/CN2020/135576
§ 371 (c)(1),
(2) Date: Aug. 23, 2022

(87) PCT Pub. No.: WO2021/169488
PCT Pub. Date: Sep. 2, 2021

(65) Prior Publication Data
US 2023/0086915 A1    Mar. 23, 2023

(30) Foreign Application Priority Data
Feb. 24, 2020 (CN) .................... 202010113170.6

(51) Int. Cl.
*G01R 31/392* (2019.01)
*G01R 31/3842* (2019.01)
*G01R 31/396* (2019.01)

(52) U.S. Cl.
CPC ....... *G01R 31/392* (2019.01); *G01R 31/3842* (2019.01); *G01R 31/396* (2019.01)

(58) Field of Classification Search
CPC . G01R 31/392; G01R 31/396; G01R 31/3842
See application file for complete search history.

(56) References Cited

U.S. PATENT DOCUMENTS 10,317,477 B2 * 6/2019 Ueno ................... G01R 31/392

FOREIGN PATENT DOCUMENTS

| CN | 106908727 | 6/2017 |
|---|---|---|
| CN | 107256987 | 10/2017 |

(Continued)

OTHER PUBLICATIONS

International Search Report and Written Opinion for International (PCT) Patent Application No. PCT/CN2020/135576, dated Mar. 8, 2021, 7 pages.

(Continued)

*Primary Examiner* — Walter L Lindsay, Jr.
*Assistant Examiner* — Milton Gonzalez
(74) *Attorney, Agent, or Firm* — Sheridan Ross P.C.

(57) ABSTRACT

The method includes: receiving collected electrical signal information of all cells in each traction battery; performing self-discharge observation and calculating a self-discharge rate based on a cell voltage in electrical signal information of each cell after depolarization is completed, to determine whether there is an internal short circuit in a traction battery where the cell corresponding to the self-discharge rate is located; and triggering alarm handling for the internal short circuit in the traction battery based on a back-fed result that there is an internal short circuit in the traction battery. In this way, a problem of how to monitor a micro-internal short circuit in a traction battery in a good static working condition with accuracy and efficiency while taking operation into consideration is solved, thereby improving accuracy and efficiency of monitoring an internal short circuit in the traction battery while taking operation into account.

18 Claims, 3 Drawing Sheets

(56) References Cited

FOREIGN PATENT DOCUMENTS

| CN | 108160531 | 6/2018 |
| CN | 111257764 | 6/2020 |
| JP | 2012-141166 | 7/2012 |
| JP | 2014-134395 | 7/2014 |

OTHER PUBLICATIONS

English Translation of the International Search Report for International (PCT) Patent Application No. PCT/CN2020/135576, dated Mar. 8, 2021, 2 pages.

* cited by examiner

METHOD AND SYSTEM FOR MONITORING BATTERY SHORT CIRCUIT AND APPARATUS

CROSS REFERENCE TO RELATED APPLICATIONS

This application is a national stage application under 35 U.S.C. 371 and claims the benefit of PCT Application No. PCT/CN2020/135576 having an international filing date of 11 Dec. 2020, which designated the United States, which PCT application claimed the benefit of China Patent Application No. 202010113170.6 filed 24 Feb. 2020, the disclosures of each of which are incorporated herein by reference in their entireties.

TECHNICAL FIELD

The disclosure relates to the field of technologies for monitoring a battery short circuit, and in particular, to a method and system for monitoring a battery short circuit and an apparatus.

BACKGROUND ART

An internal short circuit in a traction battery of an electric vehicle is one of the main causes of thermal runaway in the battery. A short circuit in a part of a battery causes a temperature to rise rapidly, which will cause thermal runaway in more areas of the battery, and further cause a failure in an entire cell or even an entire battery pack. When there is a severe internal short circuit in the battery, the partial short circuit causes power consumption, a voltage decreases rapidly, a temperature increases quickly, and an insulation resistance value decreases quickly. In a conventional monitoring technology, by monitoring a changing process of thermal runaway mentioned above of a traction battery, a battery management system (BMS) will give an alarm when there is thermal runaway in the battery, but in this case, the situation has seriously threatened safety of a vehicle and people in the vehicle are threatened.

A micro-internal short circuit already occurs before a severe partial internal short circuit occurs in a traction battery, which consumes extra power of the traction battery, causing a voltage to decrease gradually. In a long-time quasi-static working condition, a micro-internal short circuit of a traction battery can be detected by monitoring a voltage change of the traction battery. However, a traction battery is on a vehicle. When the traction battery is being used, running of a large number of vehicle-mounted devices causes electrical interference, or less data of the power battery is collected and uploaded during parking. As a result, a change in the traction battery which remains static for a long time is difficult to be monitored, and consequently it is impossible to obtain accurate monitoring results only by relying on a BMS with extremely limited and computational analysis capabilities to perform computational analysis on a limited amount of data.

Therefore, it is significant to select an environment in which a traction battery is often stored and in which continuous and stable battery detection is supported in a static working condition for a long time.

SUMMARY OF THE DISCLOSURE

In order to overcome the foregoing defects, the disclosure proposes a method and system for monitoring a battery short circuit and an apparatus, to solve or at least partially solve the problem of how to monitor a micro-internal short circuit in a traction battery accurately and efficiently.

According to a first aspect, a method for monitoring a battery short circuit is provided, including: receiving collected electrical signal information of all cells in each traction battery; performing self-discharge observation and calculating a self-discharge rate based on a cell voltage in electrical signal information of each cell after depolarization is completed, to determine whether there is an internal short circuit in a traction battery where the cell corresponding to the self-discharge rate is located; and triggering alarm handling for the internal short circuit in the traction battery based on a back-fed result that there is an internal short circuit in the traction battery.

The receiving collected electrical signal information of all cells in each traction battery specifically includes: in a case where the traction battery remains stationary in a battery swap station for a long time, collecting in real time, by a battery swap station-side, the electrical signal information of all the cells in each traction battery stored in the battery swap station, where the real-time collection includes: collecting the electrical signal information of all the cells in each traction battery during charging and after charging is completed in a case where the traction battery remains stationary in the battery swap station, where the electrical signal information of each cell at least includes: a single-cell voltage, a current, a temperature, and a state of charge (SOC); uploading, by the battery swap station-side, the collected electrical signal information of all the cells in the traction battery synchronously to the cloud or a local control device of the battery swap station; and receiving, on the cloud or by the local control device of the battery swap station, the electrical signal information and storing the information based on a collection time at which the information is collected in real time.

The performing self-discharge observation and calculating a self-discharge rate based on a cell voltage in electrical signal information of each cell after depolarization is completed, to determine whether there is an internal short circuit in a traction battery where the cell corresponding to the self-discharge rate is located specifically includes: determining, based on the collection time of the electrical signal information of each cell, a time at which the traction battery where the cell is located stops being charged; selecting, based on the time at which the traction battery stops being charged and depolarization duration corresponding to a type of the traction battery, a starting time of a first phase of self-discharge observation and calculation on the cell voltage of each cell in the traction battery; performing the first phase of self-discharge observation and calculation on the cell voltage of each cell in the traction battery from the starting time, to obtain a first-phase self-discharge rate of the cell; determining, based on the first-phase self-discharge rate of each cell, whether to perform a second phase of self-discharge observation and calculation for the traction battery where the cell is located; starting to perform, if the determination is yes after the first phase of self-discharge observation and calculation is completed, the second phase of self-discharge observation and calculation on the cell voltage of each cell in the traction battery with duration greater than that of the first phase of self-discharge observation and calculation, to obtain a second-phase self-discharge rate of each cell; and determining, based on the second-phase self-discharge rate of each cell, whether there is an internal short circuit in the traction battery where the cell is located.

The determining, based on the collection time of the electrical signal information of each cell, a time at which the traction battery where the cell is located stops being charged specifically includes: selecting, from the electrical signal information based on a sequence of the collection time corresponding to all the cells in the traction battery, a time at which currents of all the cells are 0 as the time at which the charging stops; and the selecting, based on the time at which the traction battery stops being charged and depolarization duration corresponding to a type of the traction battery, a starting time of a first phase of self-discharge observation and calculation on the cell voltage of each cell in the traction battery specifically includes: determining, through tests, depolarization duration corresponding to the type of each traction battery; and selecting, as the starting time of the first phase of self-discharge observation and calculation on the cell voltage of each cell in the traction battery after the depolarization is completed, a time point with duration greater than a sum of the time at which the charging stops and the depolarization duration.

The performing the first phase of self-discharge observation and calculation on the cell voltage of each cell in the traction battery from the starting time, to obtain a first-phase self-discharge rate of the cell specifically includes: calculating a first-phase self-discharge rate p1Sdr1 of the observed $j^{th}$ cell within duration P1_time of the first phase of self-discharge observation and calculation:

$$p1Sdr = \left| \frac{v_{i,j} - v_{1,j}}{t_{i,j} - t_{1,j}} \right|, \qquad \text{Formula 1}$$

where $v_{i,j}$ represents a cell voltage of the $j^{th}$ cell at a moment ti, $v_{1,j}$ represents a cell voltage of the $j^{th}$ cell at a moment t1, $t_{i,j}$ represents the moment ti related to the $j^{th}$ cell, and $t_{1,j}$ represents the moment t1, before $t_{i,j}$, related to the $j^{th}$ cell.

The calculating a first-phase self-discharge rate p1Sdr1 of the observed $j^{th}$ cell within duration P1_time of the first phase of self-discharge observation and calculation specifically includes: if the time point ti at which the observation ends is less than a sum of the time point t1 at which the observation starts and P1_time, selecting a cell voltage of the $j^{th}$ cell within the time period from t1 to t1+P1_time for observation, and calculating a first-phase self-discharge rate p1Sdr of the $j^{th}$ cell:

$$p1Sdr = \left| \frac{v_{t_i,j} - v_{t_1,j}}{t_{t_i,j} - t_{t_1,j}} \right|, \qquad \text{Formula 2}$$

where $t_{t_i,j}$ represents the moment ti that is selected from the time period from t1 to t1+P1_time for the observation of a cell voltage of the $j^{th}$ cell, and in this case, the corresponding voltage of the $j^{th}$ cell is $v_{t_i,j}$; and $t_{t_1,j}$ represents the moment t1, earlier than $t_{t_i,j}$, that is selected from the time period from t1 to t1+P1_time as a starting time for the observation of a cell voltage of the $j^{th}$ cell, and in this case, the corresponding cell voltage of the $j^{th}$ cell is $v_{t_1,j}$; or if the time point ti at which the observation ends is greater than the sum of the time point t1 at which the observation starts and P1_time, selecting a cell voltage of the $j^{th}$ cell within the time period from ti to ti+P1_time for observation, and calculating the first-phase self-discharge rate p1Sdr of the $j^{th}$ cell:

$$p1Sdr = \left| \frac{v_{t_i,j} - v_{t_i-P1_{time},j}}{t_{t_i,j} - t_{t_i-P1_{time},j}} \right|, \qquad \text{Formula 3}$$

where $t_{t_i,j}$ represents the moment ti selected from the time period from ti to ti+P1_time for the observation of a cell voltage of the $j^{th}$ cell, and in this case, the corresponding cell voltage of the $j^{th}$ cell is $v_{t_i,j}$; and $t_{t_i-P1\_time,j}$ represents a moment $t_i$–P1_time, earlier than $t_{t_i,j}$, that is selected from the time period from ti to ti+P1_time as a starting time for the observation of a cell voltage of the $j^{th}$ cell, and in this case, the corresponding cell voltage of the $j^{th}$ cell is $v_{t_i-P1\_time,j}$.

The performing the first phase of self-discharge observation and calculation on the cell voltage of each cell in the traction battery from the starting time, to obtain a first-phase self-discharge rate of the cell specifically includes: performing a linear fitting calculation on all cell voltages of the $j^{th}$ cell within the duration P1_time of the first phase of self-discharge observation and calculation:

$$v\hat{} = v_0 + kt_i \qquad \text{Formula 5,}$$

where $v\hat{}$ represents all voltages of the cell j within a specific time period, $v_0$ represents an initial voltage at a starting time of this period, $t_i$ represents an ending time point of this period, and a slope k is equal to a self-discharge rate sdr1.

The determining, based on the first-phase self-discharge rate of each cell, whether to perform a second phase of self-discharge observation and calculation for the traction battery where the cell is located specifically includes: comparing the first-phase self-discharge rate p1Sdr or sdr1 of each cell with a first threshold s1; when the first-phase self-discharge rate p1Sdr of the cell is greater than the first threshold s1 or sdr1 is greater than the first threshold s1, determining that the traction battery where the cell is located requires the second phase of self-discharge observation and calculation; and when the first-phase self-discharge rate p1Sdr of the cell is less than or equal to the first threshold s1 or sdr1 is less than or equal to the first threshold s1, determining that the traction battery where the cell is located has no risk of internal short circuit and is allowed for normal exchange.

The starting to perform, if the determination is yes after the first phase of self-discharge observation and calculation is completed, a second phase of self-discharge observation and calculation on the cell voltage of each cell in the traction battery with duration greater than that of the first phase of self-discharge observation and calculation, to obtain a second-phase self-discharge rate of each cell specifically includes: performing, after the first phase of self-discharge observation and calculation is completed, the second phase of self-discharge observation and calculation on the cell voltage of each cell in the traction battery that requires the second phase of self-discharge observation and calculation, where a self-discharge rate p2S dr of the $j^{th}$ cell within duration P2_time of the second phase of self-discharge observation and calculation is calculated:

$$p2Sdr = \left| \frac{v_{i+P2_{time},j} - v_{i,j}}{t_{i+P2_{time},j} - t_{i,j}} \right|, \qquad \text{Formula 4}$$

where $t_{i+P2\_time,j}$ represents a moment $t_{i+P2\_time}$ that is selected from a time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i+P2\_time,j}$; and $t_{i,j}$ represents the moment $t_i$, earlier than $t_{i+P2\_time}$, that is selected from the time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i,j}$, where the duration P2_time of the second phase of self-discharge observation and calculation is n times as long as the duration P1_time of the first phase of self-discharge observation and calculation, and n∈[2, 10].

The starting to perform, if the determination is yes after the first phase of self-discharge observation and calculation is completed, a second phase of self-discharge observation and calculation on the cell voltage of each cell in the traction battery with duration greater than that of the first phase of self-discharge observation and calculation, to obtain a second-phase self-discharge rate of each cell specifically includes: performing, after the first phase of self-discharge observation and calculation is completed, the second phase of self-discharge observation and calculation on the cell voltage of each cell in the traction battery that requires the second phase of self-discharge observation and calculation, and performing a linear fitting calculation on all the cell voltages of the $j^{th}$ cell within the duration P2_time of the second phase of self-discharge observation and calculation:

$$v\hat{} = v_0 + kt_i \quad \text{Formula 5,}$$

where v^ represents all voltages of the cell j within a specific time period, $v_0$ represents an initial voltage at a starting time of this period, $t_i$ represents an ending time point of this period, and a slope k is equal to a self-discharge rate sdr2.

The determining, based on the second-phase self-discharge rate of each cell, whether there is an internal short circuit in the traction battery where the cell is located specifically includes: comparing the second-phase self-discharge rate p2Sdr or sdr2 of each cell with a second threshold s2; when the second-phase self-discharge rate p2Sdr of the cell is greater than the second threshold s2 or sdr2 is greater than the second threshold s2, determining that there is an internal short circuit in the traction battery where the cell is located; and when the second-phase self-discharge rate p2Sdr of the cell is less than or equal to the second threshold s2 or sdr2 is less than or equal to the second threshold s2, determining that the traction battery where the cell is located has no risk of internal short circuit and is allowed for normal exchange, where the preset first threshold s1 is greater than the second threshold s2 that is greater than a specified value of a self-discharge rate of the cell, and a value range of s1 and s2 is 0.1 to 100.

The triggering alarm handling for the internal short circuit in the traction battery based on a back-fed result that there is an internal short circuit in the traction battery specifically includes: feeding back, on the cloud or by the local control device of the battery swap station after each phase of observation and calculation is completed, a result about whether there is an internal short circuit in the traction battery to the corresponding battery swap station-side; and when the result received by the battery swap station is that there is an internal short circuit in the traction battery, triggering, by the battery swap station, alarm handling for the internal short circuit in the traction battery, where the alarm handing includes: giving an alarm, stopping usage of the traction battery, and initiating a return and repair process.

According to a second aspect, a system for monitoring a battery short circuit is provided, including: a receiving and storage apparatus configured to receive collected electrical signal information of all cells in each traction battery; a phased-calculation apparatus configured to perform self-discharge observation and calculate a self-discharge rate based on a cell voltage in electrical signal information of each cell after depolarization is completed, to determine whether there is an internal short circuit in a traction battery where the cell corresponding to the self-discharge rate is located; and an alarm apparatus configured to trigger alarm handling for the internal short circuit in the traction battery based on a back-fed result that there is an internal short circuit in the traction battery.

The receiving and storage apparatus specifically includes: in a case where the traction battery remains stationary in a battery swap station for a long time, collecting in real time, by a battery swap station-side, the electrical signal information of all the cells in each traction battery stored in the battery swap station, where the real-time collection includes: collecting the electrical signal information of all the cells in each traction battery during charging and after charging is completed in a case where the traction battery remains stationary in the battery swap station, where the electrical signal information of each cell at least includes: a single-cell voltage, a current, a temperature, and a state of charge (SOC); uploading, by the battery swap station-side, the collected electrical signal information of all the cells in the traction battery synchronously to the cloud or a local control device of the battery swap station; and receiving, on the cloud or by the local control device of the battery swap station, the electrical signal information and storing the information based on a collection time at which the information is collected in real time.

The phased-calculation apparatus specifically includes: a charging stop time apparatus configured to determine, based on the collection time of the electrical signal information of each cell, a time at which the traction battery where the cell is located stops being charged; a first-phase start selection apparatus configured to select, based on the time at which the traction battery stops being charged and depolarization duration corresponding to a type of the traction battery, a starting time of a first phase of self-discharge observation and calculation on the cell voltage of each cell in the traction battery; a first-phase calculation apparatus configured to perform the first phase of self-discharge observation and calculation on the cell voltage of each cell in the traction battery from the starting time, to obtain a first-phase self-discharge rate of the cell; and determining, based on the first-phase self-discharge rate of each cell, whether to perform a second phase of self-discharge observation and calculation for the traction battery where the cell is located; a second-phase calculation apparatus configured to: start to perform, if the determination is yes after the first phase of self-discharge observation and calculation is completed, the second phase of self-discharge observation and calculation on the cell voltage of each cell in the traction battery with duration greater than that of the first phase of self-discharge observation and calculation, to obtain a second-phase self-discharge rate of each cell; and determining, based on the second-phase self-discharge rate of each cell, whether there is an internal short circuit in the traction battery where the cell is located.

The charging stop time apparatus specifically includes: selecting, from the electrical signal information based on a sequence of the collection time corresponding to all the cells in the traction battery, a time at which currents of all the cells are 0 as the time at which the charging stops; and The first-phase start selection apparatus specifically includes: determining, through tests, depolarization duration corresponding to the type of each traction battery; and selecting, as the starting time of the first phase of self-discharge observation and calculation on the cell voltage of each cell in the traction battery after the depolarization is completed, a time point with duration greater than a sum of the time at which the charging stops and the depolarization duration.

The first-phase calculation apparatus specifically includes: calculating a first-phase self-discharge rate p1Sdr1 of the observed $j^{th}$ cell within duration P1_time of the first phase of self-discharge observation and calculation:

$$p1Sdr = \left| \frac{v_{i,j} - v_{1,j}}{t_{i,j} - t_{1,j}} \right|, \quad \text{Formula 1}$$

where $v_{i,j}$ represents a cell voltage of the $j^{th}$ cell at a moment ti, $v_{1,j}$ represents a cell voltage of the $j^{th}$ cell at a moment t1, $t_{i,j}$ represents the moment ti related to the $j^{th}$ cell, and $t_{1,j}$ represents the moment t1, before $t_{i,j}$, related to the $j^{th}$ cell.

The first-phase calculation apparatus further includes: if the time point ti at which the observation ends is less than a sum of the time point t1 at which the observation starts and P1_time, selecting a cell voltage of the $j^{th}$ cell within the time period from t1 to t1+P1_time for observation, and calculating a first-phase self-discharge rate p1Sdr of the $j^{th}$ cell:

$$p1Sdr = \left| \frac{v_{t_i,j} - v_{t_1,j}}{t_{t_i,j} - t_{t_1,j}} \right|, \quad \text{Formula 2}$$

where $t_{t_i,j}$ represents the moment ti that is selected from the time period from t1 to t1+P1_time for the observation of a cell voltage of the $j^{th}$ cell, and in this case, the corresponding voltage of the $j^{th}$ cell is $v_{t_i,j}$; and $t_{t_1,j}$ represents the moment t1, earlier than $t_{t_i,j}$, that is selected from the time period from t1 to t1+P1_time as a starting time for the observation of a cell voltage of the $j^{th}$ cell, and in this case, the corresponding cell voltage of the $j^{th}$ cell is $v_{t_1,j}$; or if the time point ti at which the observation ends is greater than the sum of the time point t1 at which the observation starts and P1_time, selecting a cell voltage of the $j^{th}$ cell within the time period from ti to ti+P1_time for observation, and calculating the first-phase self-discharge rate p1Sdr of the $j^{th}$ cell:

$$p1Sdr = \left| \frac{v_{t_i,j} - v_{t_i-P1_{time},j}}{t_{t_i,j} - t_{t_i-P1_{time},j}} \right|, \quad \text{Formula 3}$$

where $t_{t_i,j}$ represents the moment ti selected from the time period from ti to ti+P1_time for the observation of a cell voltage of the $j^{th}$ cell, and in this case, the corresponding cell voltage of the $j^{th}$ cell is $v_{t_i,j}$; and $t_{t_i-P1_{time},j}$ represents a moment ti−P1_time, earlier than $t_{t_i,j}$, that is selected from the time period from ti to ti+P1_time as a starting time for the observation of a cell voltage of the $j^{th}$ cell, and in this case, the corresponding cell voltage of the $j^{th}$ cell is $v_{t_i-P1_{time},j}$.

The first-phase calculation apparatus specifically includes: performing a linear fitting calculation on all cell voltages of the $j^{th}$ cell within the duration P1_time of the first phase of self-discharge observation and calculation:

$$v\hat{} = v_0 + kt_i \quad \text{Formula 5,}$$

where $v\hat{}$ represents all voltages of the cell j within a specific time period, v0 represents an initial voltage at a starting time of this period, ti represents an ending time point of this period, and a slope k is equal to a self-discharge rate sdr1.

The first-phase calculation apparatus specifically includes: comparing the first-phase self-discharge rate p1Sdr or sdr1 of each cell with a first threshold s1; when the first-phase self-discharge rate p1Sdr of the cell is greater than the first threshold s1 or sdr1 is greater than the first threshold s1, determining that the traction battery where the cell is located requires the second phase of self-discharge observation and calculation; and when the first-phase self-discharge rate p1Sdr of the cell is less than or equal to the first threshold s1 or sdr1 is less than or equal to the first threshold s1, determining that the traction battery where the cell is located has no risk of internal short circuit and is allowed for normal exchange.

The second-phase calculation apparatus specifically includes: performing, after the first phase of self-discharge observation and calculation is completed, the second phase of self-discharge observation and calculation on the cell voltage of each cell in the traction battery that requires the second phase of self-discharge observation and calculation, where a self-discharge rate p2Sdr of the $j^{th}$ cell within duration P2_time of the second phase of self-discharge observation and calculation is calculated:

$$p2Sdr = \left| \frac{v_{i+P2_{time},j} - v_{i,j}}{t_{i+P2_{time},j} - t_{i,j}} \right|, \quad \text{Formula 4}$$

where $t_{i+P2\_time,j}$ represents a moment $t_{i+P2\_time}$ that is selected from a time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i+P2\_time,j}$; and $t_{i,j}$ represents the moment $t_i$, earlier than $t_{i+P2\_time}$, that is selected from the time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i,j}$, where the duration P2_time of the second phase of self-discharge observation and calculation is n times as long as the duration P1_time of the first phase of self-discharge observation and calculation, and n∈[2, 10].

The second-phase calculation apparatus specifically includes: performing, after the first phase of self-discharge observation and calculation is completed, the second phase of self-discharge observation and calculation on the cell voltage of each cell in the traction battery that requires the second phase of self-discharge observation and calculation, and performing a linear fitting calculation on all the cell voltages of the $j^{th}$ cell within the duration P2_time of the second phase of self-discharge observation and calculation:

$$v\hat{} = v_0 + kt_i \quad \text{Formula 5,}$$

where $v\hat{}$ represents all voltages of the cell j within a specific time period, $v_0$ represents an initial voltage at a starting time of this period, $t_i$ represents an ending time point of this period, and a slope k is equal to a self-discharge rate sdr2.

The second-phase calculation apparatus further includes: comparing the second-phase self-discharge rate p2Sdr or sdr2 of each cell with a second threshold s2; when the second-phase self-discharge rate p2Sdr of the cell is greater than the second threshold s2 or sdr2 is greater than the second threshold s2, determining that there is an internal short circuit in the traction battery where the cell is located; and when the second-phase self-discharge rate p2Sdr of the cell is less than or equal to the second threshold s2 or sdr2 is less than or equal to the second threshold s2, determining that the traction battery where the cell is located has no risk of internal short circuit and is allowed for normal exchange, where the preset first threshold s1 is greater than the second threshold s2 that is greater than a specified value of a self-discharge rate of the cell, and a value range of s1 and s2 is 0.1 to 100.

The alarm apparatus specifically includes: feeding back, on the cloud or by the local control device of the battery swap station after each phase of observation and calculation is completed, a result about whether there is an internal short circuit in the traction battery to the corresponding battery swap station-side; and when the result received by the battery swap station is that there is an internal short circuit in the traction battery, triggering, by the battery swap station, alarm handling for the internal short circuit in the traction battery, where the alarm handing includes: giving an alarm, stopping usage of the traction battery, and initiating a return and repair process.

According to a third aspect, a storage apparatus storing a plurality of pieces program codes is provided, where the program codes are adapted to be loaded and run by a processor to perform the method for monitoring a battery short circuit according to any one of the foregoing aspects.

According to a fourth aspect, a control apparatus including a processor and a storage apparatus is provided, where the storage apparatus is adapted to store a plurality of pieces program codes, and the program codes are adapted to be loaded and run by the processor to perform the method for monitoring a battery short circuit according to any one of the foregoing aspects.

Solution 1: A method for monitoring a battery short circuit, where including:
receiving collected electrical signal information of all cells in each traction battery;
performing self-discharge observation and calculating a self-discharge rate based on a cell voltage in electrical signal information of each cell after depolarization is completed, to determine whether there is an internal short circuit in a traction battery where the cell corresponding to the self-discharge rate is located; and
triggering alarm handling for the internal short circuit in the traction battery based on a back-fed result that there is an internal short circuit in the traction battery.

Solution 2: The method according to solution 1, where the receiving collected electrical signal information of all cells in each traction battery specifically includes:
in a case where the traction battery remains stationary in a battery swap station for a long time, collecting in real time, by a battery swap station-side, the electrical signal information of all the cells in each traction battery stored in the battery swap station, where the real-time collection includes: collecting the electrical signal information of all the cells in each traction battery during charging and after charging is completed in a case where the traction battery remains stationary in the battery swap station,
where the electrical signal information of each cell at least includes: a single-cell voltage, a current, a temperature, and a state of charge (SOC);
uploading, by the battery swap station-side, the collected electrical signal information of all the cells in the traction battery synchronously to the cloud or a local control device of the battery swap station; and
receiving, on the cloud or by the local control device of the battery swap station, the electrical signal information and storing the information based on a collection time at which the information is collected in real time.

Solution 3: The method according to solution 2, where the performing self-discharge observation and calculating a self-discharge rate based on a cell voltage in electrical signal information of each cell after depolarization is completed, to determine whether there is an internal short circuit in a traction battery where the cell corresponding to the self-discharge rate is located specifically includes:
determining, based on the collection time of the electrical signal information of each cell, a time at which the traction battery where the cell is located stops being charged;
selecting, based on the time at which the traction battery stops being charged and depolarization duration corresponding to a type of the traction battery, a starting time of a first phase of self-discharge observation and calculation on the cell voltage of each cell in the traction battery;
performing the first phase of self-discharge observation and calculation on the cell voltage of each cell in the traction battery from the starting time, to obtain a first-phase self-discharge rate of the cell;
determining, based on the first-phase self-discharge rate of each cell, whether to perform a second phase of self-discharge observation and calculation for the traction battery where the cell is located;
starting to perform, if the determination is yes after the first phase of self-discharge observation and calculation is completed, the second phase of self-discharge observation and calculation on the cell voltage of each cell in the traction battery with duration greater than that of the first phase of self-discharge observation and calculation, to obtain a second-phase self-discharge rate of each cell; and
determining, based on the second-phase self-discharge rate of each cell, whether there is an internal short circuit in the traction battery where the cell is located.

Solution 4: The method according to solution 3, where the determining, based on the collection time of the electrical signal information of each cell, a time at which the traction battery where the cell is located stops being charged specifically includes:
selecting, from the electrical signal information based on a sequence of the collection time corresponding to all the cells in the traction battery, a time at which currents of all the cells are 0 as the time at which the charging stops; and
the selecting, based on the time at which the traction battery stops being charged and depolarization duration corresponding to a type of the traction battery, a starting time of a first phase of self-discharge observation and calculation on the cell voltage of each cell in the traction battery specifically includes:
determining, through tests, depolarization duration corresponding to the type of each traction battery; and selecting, as the starting time of the first phase of self-discharge observation and calculation on the cell voltage of each cell in the traction battery after the depolarization is completed, a time point with duration greater than a sum of the time at which the charging stops and the depolarization duration.

Solution 5: The method according to solution 4, where the performing the first phase of self-discharge observation and calculation on the cell voltage of each cell in the traction battery from the starting time, to obtain a first-phase self-discharge rate of the cell specifically includes:

calculating a first-phase self-discharge rate p1Sdr1 of the observed $j^{th}$ cell within duration P1_time of the first phase of self-discharge observation and calculation:

$$p1Sdr = \left| \frac{v_{i,j} - v_{1,j}}{t_{i,j} - t_{1,j}} \right|, \quad \text{Formula 1}$$

where $v_{i,j}$ represents a cell voltage of the $j^{th}$ cell at a moment ti, $v_{1,j}$ represents a cell voltage of the $j^{th}$ cell at a moment t1, $t_{i,j}$ represents the moment ti related to the $j^{th}$ cell, and $t_{1,j}$ represents the moment t1, before $t_{i,j}$, related to the $j^{th}$ cell.

Solution 6: The method according to solution 5, where the calculating a first-phase self-discharge rate p1Sdr1 of the observed $j^{th}$ cell within duration P1_time of the first phase of self-discharge observation and calculation specifically includes:

if the time point ti at which the observation ends is less than a sum of the time point t1 at which the observation starts and P1_time, selecting a cell voltage of the $j^{th}$ cell within the time period from t1 to t1+P1_time for observation, and calculating a first-phase self-discharge rate p1Sdr of the $j^{th}$ cell:

$$p1Sdr = \left| \frac{v_{t_i,j} - v_{t_1,j}}{t_{t_i,j} - t_{t_1,j}} \right|, \quad \text{Formula 2}$$

where $t_{t_i,j}$ represents the moment ti that is selected from the time period from t1 to t1+P1_time for the observation of a cell voltage of the $j^{th}$ cell, and in this case, the corresponding voltage of the $j^{th}$ cell is $v_{t_i,j}$; and $t_{t_1,j}$ represents the moment t1, earlier than $t_{t_i,j}$, that is selected from the time period from t1 to t1+P1_time as a starting time for the observation of a cell voltage of the $j^{th}$ cell, and in this case, the corresponding cell voltage of the $j^{th}$ cell is $v_{t_1,j}$; or if the time point ti at which the observation ends is greater than the sum of the time point t1 at which the observation starts and P1_time, selecting a cell voltage of the $j^{th}$ cell within the time period from ti to ti+P1_time for observation, and calculating the first-phase self-discharge rate p1Sdr of the $j^{th}$ cell:

$$p1Sdr = \left| \frac{v_{t_i,j} - v_{t_i - P1_{time},j}}{t_{t_i,j} - t_{t_i - P1_{time},j}} \right|, \quad \text{Formula 3}$$

where $t_{t_i,j}$ represents the moment ti selected from the time period from ti to ti+P1_time for the observation of a cell voltage of the $j^{th}$ cell, and in this case, the corresponding cell voltage of the $j^{th}$ cell is $v_{t_i,j}$; and $t_{t_i-P1\_time,j}$ represents a moment $t_i$–P1_time, earlier than $t_{t_i,j}$, that is selected from the time period from ti to ti+P1_time as a starting time for the observation of a cell voltage of the $j^{th}$ cell, and in this case, the corresponding cell voltage of the $j^{th}$ cell is $v_{t_i-P1\_time,j}$.

Solution 7: The method according to solution 4, where the performing the first phase of self-discharge observation and calculation on the cell voltage of each cell in the traction battery from the starting time, to obtain a first-phase self-discharge rate of the cell specifically includes:

performing a linear fitting calculation on all cell voltages of the $j^{th}$ cell within the duration P1_time of the first phase of self-discharge observation and calculation:

$$v\hat{} = v_0 + k t_i \quad \text{Formula 5,}$$

where $v\hat{}$ represents all voltages of the cell j within a specific time period, $v_0$ represents an initial voltage at a starting time of this period, $t_i$ represents an ending time point of this period, and a slope k is equal to a self-discharge rate sdr1.

Solution 8. The method according to solution 5, 6, or 7, the determining, based on the first-phase self-discharge rate of each cell, whether to perform a second phase of self-discharge observation and calculation for the traction battery where the cell is located specifically includes:

comparing the first-phase self-discharge rate p1Sdr or sdr1 of each cell with a first threshold s1;

when the first-phase self-discharge rate p1Sdr of the cell is greater than the first threshold s1 or sdr1 is greater than the first threshold s1, determining that the traction battery where the cell is located requires the second phase of self-discharge observation and calculation; and when the first-phase self-discharge rate p1Sdr of the cell is less than or equal to the first threshold s1 or sdr1 is less than or equal to the first threshold s1, determining that the traction battery where the cell is located has no risk of internal short circuit and is allowed for normal exchange.

Solution 9: The method according to solution 8, where the starting to perform, if the determination is yes after the first phase of self-discharge observation and calculation is completed, a second phase of self-discharge observation and calculation on the cell voltage of each cell in the traction battery with duration greater than that of the first phase of self-discharge observation and calculation, to obtain a second-phase self-discharge rate of each cell specifically includes:

performing, after the first phase of self-discharge observation and calculation is completed, the second phase of self-discharge observation and calculation on the cell voltage of each cell in the traction battery that requires the second phase of self-discharge observation and calculation, where a self-discharge rate p2S dr of the $j^{th}$ cell within duration P2_time of the second phase of self-discharge observation and calculation is calculated:

$$p2Sdr = \left| \frac{v_{i+P2_{time},j} - v_{i,j}}{t_{i+P2_{time},j} - t_{i,j}} \right|, \quad \text{Formula 4}$$

where $t_{i+P2\_time,j}$ represents a moment $t_{i+P2\_time}$ that is selected from a time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i+P2\_time,j}$; and $t_{i,j}$ represents the moment $t_i$, earlier than $t_{i+P2\_time}$, that is selected from the time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i,j}$, where the duration P2_time of the second phase of self-discharge observation and calculation is n times as long as the duration P1_time of the first phase of self-discharge observation and calculation, and n∈[2, 10].

Solution 10: The method according to solution 8, where the starting to perform, if the determination is yes after the first phase of self-discharge observation and calculation is completed, a second phase of self-discharge observation and calculation on the cell voltage of each cell in the traction battery with duration greater than that of the first phase of self-discharge observation and calculation, to obtain a second-phase self-discharge rate of each cell specifically includes:

performing, after the first phase of self-discharge observation and calculation is completed, the second phase of self-discharge observation and calculation on the cell voltage of each cell in the traction battery that requires the second phase of self-discharge observation and calculation, and performing a linear fitting calculation on all the cell voltages of the $j^{th}$ cell within the duration P2_time of the second phase of self-discharge observation and calculation:

$$v\hat{} = v_0 + kt_i \quad \text{Formula 5,}$$

where $v\hat{}$ represents all voltages of the cell j within a specific time period, $v_0$ represents an initial voltage at a starting time of this period, $t_i$ represents an ending time point of this period, and a slope k is equal to a self-discharge rate sdr2.

Solution 11: The method according to solution 9 or 10, where the determining, based on the second-phase self-discharge rate of each cell, whether there is an internal short circuit in the traction battery where the cell is located specifically includes:

comparing the second-phase self-discharge rate p2Sdr or sdr2 of each cell with a second threshold s2;

when the second-phase self-discharge rate p2Sdr of the cell is greater than the second threshold s2 or sdr2 is greater than the second threshold s2, determining that there is an internal short circuit in the traction battery where the cell is located; and when the second-phase self-discharge rate p2Sdr of the cell is less than or equal to the second threshold s2 or sdr2 is less than or equal to the second threshold s2, determining that the traction battery where the cell is located has no risk of internal short circuit and is allowed for normal exchange, where the preset first threshold s1 is greater than the second threshold s2 that is greater than a specified value of a self-discharge rate of the cell, and a value range of s1 and s2 is 0.1 to 100.

Solution 12: The method according to solution 11, where the triggering alarm handling for the internal short circuit in the traction battery based on a back-fed result that there is an internal short circuit in the traction battery specifically includes:

feeding back, on the cloud or by the local control device of the battery swap station after each phase of observation and calculation is completed, a result about whether there is an internal short circuit in the traction battery to the corresponding battery swap station-side; and when the result received by the battery swap station is that there is an internal short circuit in the traction battery, triggering, by the battery swap station, alarm handling for the internal short circuit in the traction battery, where the alarm handing includes: giving an alarm, stopping usage of the traction battery, and initiating a return and repair process.

Solution 13: A system for monitoring a battery short circuit, including:

a receiving and storage apparatus configured to receive collected electrical signal information of all cells in each traction battery;

a phased-calculation apparatus configured to perform self-discharge observation and calculate a self-discharge rate based on a cell voltage in electrical signal information of each cell after depolarization is completed, to determine whether there is an internal short circuit in a traction battery where the cell corresponding to the self-discharge rate is located; and an alarm apparatus configured to trigger alarm handling for the internal short circuit in the traction battery based on a back-fed result that there is an internal short circuit in the traction battery.

Solution 14: The system according to solution 13, where the receiving and storage apparatus specifically includes:

in a case where the traction battery remains stationary in a battery swap station for a long time, collecting in real time, by a battery swap station-side, the electrical signal information of all the cells in each traction battery stored in the battery swap station, where the real-time collection includes: collecting the electrical signal information of all the cells in each traction battery during charging and after charging is completed in a case where the traction battery remains stationary in the battery swap station, where the electrical signal information of each cell at least includes: a single-cell voltage, a current, a temperature, and a state of charge (SOC);

uploading, by the battery swap station-side, the collected electrical signal information of all the cells in the traction battery synchronously to the cloud or a local control device of the battery swap station; and receiving, on the cloud or by the local control device of the battery swap station, the electrical signal information and storing the information based on a collection time at which the information is collected in real time.

Solution 15: The system according to solution 14, where the phased-calculation apparatus specifically includes:

a charging stop time apparatus configured to determine, based on the collection time of the electrical signal information of each cell, a time at which the traction battery where the cell is located stops being charged;

a first-phase start selection apparatus configured to select, based on the time at which the traction battery stops being charged and depolarization duration corresponding to a type of the traction battery, a starting time of a first phase of self-discharge observation and calculation on the cell voltage of each cell in the traction battery;

a first-phase calculation apparatus configured to perform the first phase of self-discharge observation and calculation on the cell voltage of each cell in the traction battery from the starting time, to obtain a first-phase self-discharge rate of the cell; and determining, based on the first-phase self-discharge rate of each cell, whether to perform a second phase of self-discharge observation and calculation for the traction battery where the cell is located;

a second-phase calculation apparatus configured to: start to perform, if the determination is yes after the first phase of self-discharge observation and calculation is completed, the second phase of self-discharge observation and calculation on the cell voltage of each cell in the traction battery with duration greater than that of the first phase of self-discharge observation and calculation, to obtain a second-phase self-discharge rate of each cell; and determining, based on the second-phase self-discharge rate of each cell, whether there is an internal short circuit in the traction battery where the cell is located.

Solution 16: The system according to solution 15, where the charging stop time apparatus specifically includes:
  selecting, from the electrical signal information based on a sequence of the collection time corresponding to all the cells in the traction battery, a time at which currents of all the cells are 0 as the time at which the charging stops; and The first-phase start selection apparatus specifically includes: determining, through tests, depolarization duration corresponding to the type of each traction battery; and selecting, as the starting time of the first phase of self-discharge observation and calculation on the cell voltage of each cell in the traction battery after the depolarization is completed, a time point with duration greater than a sum of the time at which the charging stops and the depolarization duration.

Solution 17: The system according to solution 16, where the first-phase calculation apparatus specifically includes:
  calculating a first-phase self-discharge rate p1Sdr1 of the observed $j^{th}$ cell within duration P1_time of the first phase of self-discharge observation and calculation:

$$p1Sdr = \left| \frac{v_{i,j} - v_{1,j}}{t_{i,j} - t_{1,j}} \right|, \quad \text{Formula 1}$$

where $v_{i,j}$ represents a cell voltage of the $j^{th}$ cell at a moment ti, $v_{1,j}$ represents a cell voltage of the $j^{th}$ cell at a moment t1, $t_{i,j}$ represents the moment ti related to the $j^{th}$ cell, and $t_{1,j}$ represents the moment t1, before $t_{i,j}$, related to the $j^{th}$ cell.

Solution 18: The system according to solution 17, where the first-phase calculation apparatus further includes:
  if the time point ti at which the observation ends is less than a sum of the time point t1 at which the observation starts and P1_time, selecting a cell voltage of the $j^{th}$ cell within the time period from t1 to t1+P1_time for observation, and calculating a first-phase self-discharge rate p1Sdr of the $j^{th}$ cell:

$$p1Sdr = \left| \frac{v_{t_i,j} - v_{t_1,j}}{t_{t_i,j} - t_{t_1,j}} \right|, \quad \text{Formula 2}$$

where $t_{t_i,j}$ represents the moment ti that is selected from the time period from t1 to t1+P1_time for the observation of a cell voltage of the $j^{th}$ cell, and in this case, the corresponding voltage of the $j^{th}$ cell is $v_{t_i,j}$; and $t_{t_1,j}$ represents the moment t1, earlier than $t_{t_i,j}$, that is selected from the time period from t1 to t1+P1_time as a starting time for the observation of a cell voltage of the $j^{th}$ cell, and in this case, the corresponding cell voltage of the $j^{th}$ cell is $v_{t_1,j}$; or if the time point ti at which the observation ends is greater than the sum of the time point t1 at which the observation starts and P1_time, selecting a cell voltage of the $j^{th}$ cell within the time period from ti to ti+P1_time for observation, and calculating the first-phase self-discharge rate p1Sdr of the $j^{th}$ cell:

$$p1Sdr = \left| \frac{v_{t_i,j} - v_{t_i-P1_{time},j}}{t_{t_i,j} - t_{t_i-P1_{time},j}} \right|, \quad \text{Formula 3}$$

where $t_{t_i,j}$ represents the moment ti selected from the time period from ti to ti+P1_time for the observation of a cell voltage of the $j^{th}$ cell, and in this case, the corresponding cell voltage of the $j^{th}$ cell is $v_{t_i,j}$; and $t_{t_i-P1\_time,j}$ represents a moment ti−P1_time, earlier than $t_{t_i,j}$, that is selected from the time period from ti to ti+P1_time as a starting time for the observation of a cell voltage of the $j^{th}$ cell, and in this case, the corresponding cell voltage of the $j^{th}$ cell is $v_{t_i-P1\_time,j}$.

Solution 19: The system according to solution 16, where the first-phase calculation apparatus specifically includes:
  performing a linear fitting calculation on all cell voltages of the $j^{th}$ cell within the duration P1_time of the first phase of self-discharge observation and calculation:

$$v\hat{} = v_0 + kt_i \quad \text{Formula 5,}$$

where $v\hat{}$ represents all voltages of the cell j within a specific time period, v0 represents an initial voltage at a starting time of this period, ti represents an ending time point of this period, and a slope k is equal to a self-discharge rate sdr1.

Solution 20: The system according to solution 17, 18, or 19, where the first-phase calculation apparatus specifically includes:
  comparing the first-phase self-discharge rate p1Sdr or sdr1 of each cell with a first threshold s1;
  when the first-phase self-discharge rate p1Sdr of the cell is greater than the first threshold s1 or sdr1 is greater than the first threshold s1, determining that the traction battery where the cell is located requires the second phase of self-discharge observation and calculation; and
  when the first-phase self-discharge rate p1Sdr of the cell is less than or equal to the first threshold s1 or sdr1 is less than or equal to the first threshold s1, determining that the traction battery where the cell is located has no risk of internal short circuit and is allowed for normal exchange.

Solution 21: The system according to solution 20, where the second-phase calculation apparatus specifically includes:
  performing, after the first phase of self-discharge observation and calculation is completed, the second phase of self-discharge observation and calculation on the cell voltage of each cell in the traction battery that requires the second phase of self-discharge observation and calculation, where a self-discharge rate p2Sdr of the $j^{th}$ cell within duration P2_time of the second phase of self-discharge observation and calculation is calculated:

$$p2Sdr = \left| \frac{v_{i+P2_{time},j} - v_{i,j}}{t_{i+P2_{time},j} - t_{i,j}} \right|, \quad \text{Formula 4}$$

where $t_{i+P2\_time,j}$ represents a moment $t_{i+P2\_time}$ that is selected from a time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i+P2\_time,j}$; and $t_{i,j}$ represents the moment $t_i$, earlier than $t_{i+P2\_time}$, that is selected from the time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i,j}$, where the duration P2_time of the second phase of self-discharge observation and calculation is n times as long as the duration P1_time of the first phase of self-discharge observation and calculation, and n∈[2, 10].

Solution 22: The system according to solution 20, where the second-phase calculation apparatus specifically includes:

performing, after the first phase of self-discharge observation and calculation is completed, the second phase of self-discharge observation and calculation on the cell voltage of each cell in the traction battery that requires the second phase of self-discharge observation and calculation, and performing a linear fitting calculation on all the cell voltages of the $j^{th}$ cell within the duration P2_time of the second phase of self-discharge observation and calculation:

$$v\hat{} = v_0 + kt_i \quad \text{Formula 5,}$$

where $v\hat{}$ represents all voltages of the cell j within a specific time period, $v_0$ represents an initial voltage at a starting time of this period, $t_i$ represents an ending time point of this period, and a slope k is equal to a self-discharge rate sdr2.

Solution 23: The system according to solution 20 or 21, where the second-phase calculation apparatus further includes:

comparing the second-phase self-discharge rate p2Sdr or sdr2 of each cell with a second threshold s2;

when the second-phase self-discharge rate p2Sdr of the cell is greater than the second threshold s2 or sdr2 is greater than the second threshold s2, determining that there is an internal short circuit in the traction battery where the cell is located; and when the second-phase self-discharge rate p2Sdr of the cell is less than or equal to the second threshold s2 or sdr2 is less than or equal to the second threshold s2, determining that the traction battery where the cell is located has no risk of internal short circuit and is allowed for normal exchange, where the preset first threshold s1 is greater than the second threshold s2 that is greater than a specified value of a self-discharge rate of the cell, and a value range of s1 and s2 is 0.1 to 100.

Solution 24: The system according to solution 23, where the alarm apparatus specifically includes:

feeding back, on the cloud or by the local control device of the battery swap station after each phase of observation and calculation is completed, a result about whether there is an internal short circuit in the traction battery to the corresponding battery swap station-side; and when the result received by the battery swap station is that there is an internal short circuit in the traction battery, triggering, by the battery swap station, alarm handling for the internal short circuit in the traction battery, where the alarm handing includes: giving an alarm, stopping usage of the traction battery, and initiating a return and repair process.

Solution 25: A storage apparatus in which a plurality of program codes are stored, where the program codes are adapted to be loaded and run by a processor to perform the method for monitoring a battery short circuit according to any one of solutions 1 to 12.

Solution 26: A control apparatus, including a processor and a storage apparatus that is adapted to store a plurality of pieces program codes, where the program codes are adapted to be loaded and run by a processor to perform the method for monitoring a battery short circuit according to any one of solutions 1 to 12.

The foregoing one or more technical solutions of the disclosure have at least one or more of the following beneficial effects:

In the solutions for monitoring a battery short circuit in the disclosure, a micro-internal short circuit in a traction battery is monitored and determined. Specifically, based on a stable environment with fewer influencing factors, for example, an environment of a battery swap station where traction batteries are stored, a huge amount of electrical signal information of all cells in a traction battery is collected and stored in chronological order. Based on the huge amount of stable, accurate and long-term historical data collected in a static working condition, observation of a cell in the traction battery is performed stepwise in phases to calculate a self-discharge rate. Through a comparison between the self-discharge rate and a threshold, whether there is an internal short circuit in the traction battery where the cell is located is determined. Therefore, a more accurate calculation result can be obtained, and a high success rate of determination is achieved.

Further, the phased and stepwise observation and calculation are mainly performed in a first phase and a second phase, and a sliding window calculation method is used in some steps. Once a self-discharge rate of a cell in a traction battery calculated in the first phase exceeds a threshold, that is, is greater than a first threshold, the traction battery has to be retained and requires the second phase of observation and calculation. After the second phase of observation and calculation is completed, whether a self-discharge rate calculated in the second phase exceeds a second threshold is determined. If the self-discharge rate exceeds the second threshold, it is considered that there is a relatively great risk of internal short circuit, and an alarm is given for safety handling of the traction battery. Or, in either of a case where the self-discharge rate calculated in the first phase does not exceed the first threshold or a case where the self-discharge rate calculated in the second phase does not exceed the second threshold, it may be considered that the traction battery has no risk of internal short circuit and is allowed for normal exchange. In this way, both calculation accuracy and operational efficiency of a battery swap station can be taken into account. In addition, the sliding window method can help to accurately calculate a trend change of a monotonic variation curve, thereby saving computing resources, and improving computing efficiency. Therefore, real-time monitoring of an internal short circuit in a traction battery is implemented efficiently and accurately by taking an environment of a battery swap station as a basic environment.

BRIEF DESCRIPTION OF THE DRAWINGS

Specific implementations of the disclosure are described below with reference to the accompanying drawings, in which.

DETAILED DESCRIPTION OF EMBODIMENTS

Figure 1:
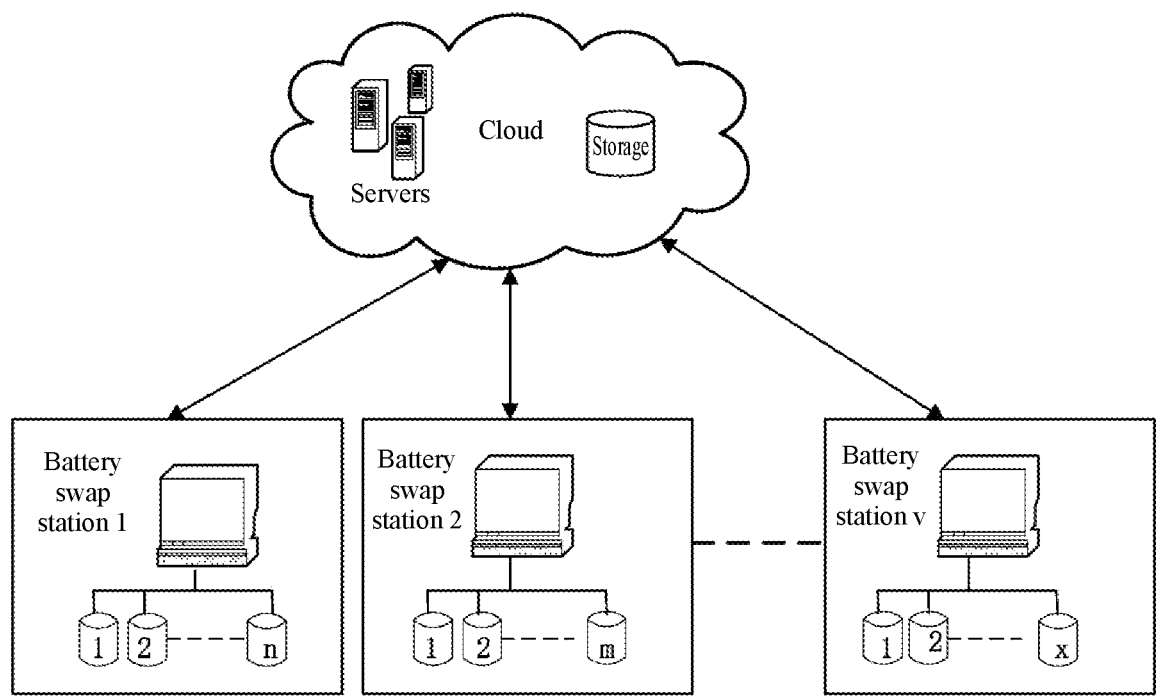
FIG. 1 is a schematic diagram of an application scenario according to an embodiment of the technical solutions for monitoring a battery short circuit of the disclosure.

Some implementations of the disclosure are described below with reference to the accompanying drawings. Those skilled in the art should understand that these implementations are only used to explain the technical principles of the disclosure, and are not intended to limit the scope of protection of the disclosure.

In the description of the disclosure, a "module" or "processor" may include hardware, software, or a combination thereof. A module may include a hardware circuit, various suitable sensors, a communication port, and a memory, or may include a software part, for example, program code, or may be a combination of software and hardware. The processor may be a central processing unit, a microprocessor, a graphics processing unit, a digital signal processor, or any other suitable processor. The processor has a data and/or signal processing function. The processor may be implemented in software, hardware, or a combination thereof. A non-transitory computer-readable storage medium includes any suitable medium that can store program code, for example, a magnetic disk, a hard disk, an optical disc, a flash memory, a read-only memory, or a random access memory. The term "A and/or B" indicates all possible combinations of A and B, for example, only A, only B, or A and B. The term "at least one of A or B" or "at least one of A and B" has a meaning similar to "A and/or B" and may include only A, only B, or A and B. The terms "a/an", "this", and "the" in the singular form may also include the plural form.

Some terms in the disclosure are explained herein first.

Static: A battery is placed statically after being charged, such that an electrode plate inside the battery is in full contact with electrolyte to be completely immersed in the electrolyte. In a polarization process of the battery, a complete solid electrolyte interphase (SEI) film is formed on the surface of the electrode plate, so that the battery has good electrical properties subsequently, and consistency between cells in a battery pack is also improved (which means that a polarization voltage is reduced and the voltage of the battery is balanced).

Working condition: a working status of a device in a condition directly related to actions of the device.

Battery cell, that is, cell: a basic battery unit of a traction battery, where a plurality of cells are connected in series or in parallel to form the traction battery.

Single-cell voltage: a voltage of a cell.

Ohmic polarization: also referred to as resistance polarization or ohmic drop arising from a current through an ohmic resistance within the electrode system. Ohmic polarization mainly depends on the electrolyte resistance and is related to the electrolyte resistivity. A higher electrolyte resistivity indicates higher polarization. In addition, ohmic polarization is related to a distance between two electrodes. When there is a separator, ohmic polarization is also related to a thickness, the number of layers, porosity and a tortuosity factor of pores of the separator, that is, ohmic polarization is related to a traction battery system or structure; and Ohmic polarization is in direct proportion to a current.

Concentration polarization/electrochemical polarization: polarization arising from changes of an interfacial potential difference due to a change of interfacial charge distribution caused by slow charge transfer. A degree of concentration polarization depends on an electrochemical reaction rate and is related to the essence of an electrochemical reaction.

Self-discharge: a phenomenon of charge reduction of a traction battery when the battery is in an open-circuit static or storage state.

Self-discharge ratio/self-discharge rate: a rate of charge reduction of a traction battery, indicating a speed of self-discharge.

In the prior art, a traction battery is generally placed at an electric vehicle-side, so that the traction battery stays static when the vehicle is parked (that is, the vehicle stays static). But in this case, only a small amount of data about the traction battery can be obtained by monitoring by using a battery management system (BMS). In addition, a data storage capacity and a computing capability of the vehicle-side are limited, and only a small amount of data about the battery obtained in a short time period can be used for determination. Consequently, accuracy of a monitoring result is low. Further, when a traction battery is being used, there is interference from a large quantity of other vehicle-mounted devices. As a result, whether there is a short circuit in the traction battery cannot possibly be monitored and determined.

In an embodiment of the solutions of the disclosure, with the utilization of an environment of a battery swap station in which traction batteries are stored is utilized, the battery swap station-side collects self-discharge signal information of each traction battery in real time when the traction battery is in a static working condition after being charged, for example, collects self-discharge signal information of all battery cells (cells) in each traction battery and uploads the information to the cloud; performs, after depolarization is completed, a first phase of self-discharge observation and calculation on the cloud based on the self-discharge signal information uploaded and stored, and determines whether a first self-discharge rate of the traction battery exceeds a first threshold; and if the first self-discharge rate exceeds the first threshold, performs a second phase of self-discharge observation and calculation for the traction battery, and determines whether a second self-discharge rate exceeds a second threshold; and if the second self-discharge rate exceeds the second threshold, it is determined that the traction battery has a high risk of internal short circuit, and subsequent processing is triggered.

FIG. 1 is a schematic diagram of an application scenario according to an embodiment of the technical solutions of the disclosure. A micro-internal short circuit already occurs before a severe partial internal short circuit occurs in a traction battery, which consumes extra power of the traction battery, causing a voltage to decrease gradually. In a long-time quasi-static working condition, a micro-internal short circuit of a traction battery can be detected by monitoring a voltage change of the traction battery. Therefore, it is necessary to find an environment where there is no interference from other vehicle-mounted devices, traction batteries can be stored for a long time, a working condition of continuous and real-time monitoring can be provided, and an internal short-circuit situation (a self-discharge ratio/self-discharge rate) of a power battery that needs to be calculated can be accurately obtained.

Each of a plurality of battery swap stations (battery swap stations 1, 2, . . . , and v shown in FIG. 1) is determined to have a working condition in which traction batteries can be monitored in real time for a long time and stored statically for a long time and are not interfered with by other vehicle-mounted devices. Therefore, when each traction battery is stored in the battery swap station before being swapped onto an electric vehicle-side, a self-discharge rate of the traction battery can be detected to monitor, in real time, whether the traction battery has a relatively great risk of internal short circuit. In other words, the solutions in which a traction battery stored in a battery swap station can be in a static working condition in an environment of the battery swap station and an internal short circuit in the battery can be monitored are implemented. The battery swap station provides an environment in which the traction battery can stay static for a long time and electrical signal information of the battery can be collected continuously.

As shown in FIG. 1, each of the plurality of battery swap stations 1, 2, . . . , and v stores, for a long period of time, a plurality of traction batteries to be swapped for electric vehicles. For example, the battery swap station 1 stores a plurality of traction batteries 1, 2, . . . , and n, the battery swap station 2 stores a plurality of traction batteries 1, 2, . . . , and m, the battery swap station v stores a plurality of traction batteries 1, 2, . . . , and x, and so on, where n, m, v, and x are all natural numbers greater than 0. In an embodiment of the disclosure, the battery swap station 1 is used as an example herein. Each battery swap station may collect electrical signal information of each of the traction batteries 1, 2, . . . , and n stored in the battery swap station 1 by using a data acquisition apparatus of the battery swap station-side, for example, a battery management system or another computer/electronic device/digital device having an electrical signal acquisition sensor or an electrical signal acquisition function. Specifically, because each traction battery includes at least one and more cells, when the traction battery is being charged and is stored statically after being charged in the battery swap station, the data acquisition apparatus of the battery swap station-side may be configured to: collect a single-cell voltage, a current, a temperature, a state of charge (SOC), and other electrical signal information of all the cells in the traction battery in real time, and upload the information synchronously to the cloud for storage. Similarly, the battery swap stations 1, 2, . . . , and v each collect, in real time, various pieces of electrical signal information of all cells in all their respective stored traction batteries, and upload the information synchronously to the cloud for corresponding storage.

Figure 2:
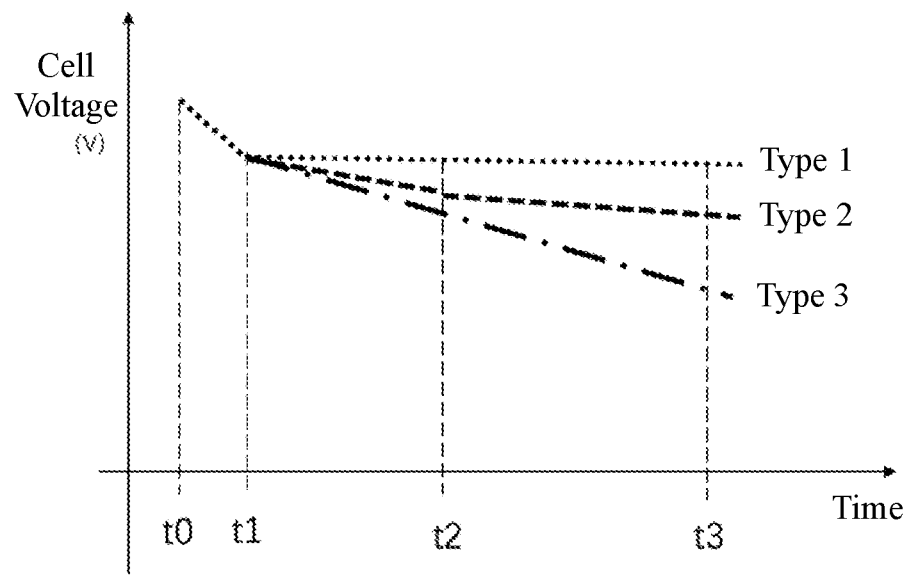
FIG. 2 is a schematic diagram of a change curve of voltages of different traction batteries after being charged according to an embodiment of the solutions of the disclosure.

Further, the cloud may store a huge amount of long-term data, and the cloud may have a plurality of servers, server groups, and the like for accurate calculation based on the huge amount of stored data, to determine a self-discharge ratio/self-discharge rate of each traction battery stored in a corresponding battery swap station, and based on this, further determine whether a traction battery corresponding to the self-discharge rate that is calculated has a great risk of internal short circuit. Specifically, each traction battery removed from an electric vehicle is charged in a battery swap station; and in the process of charging, the battery swap station-side may collect single-cell voltages, currents, temperatures, states of charge (SOC), and other electrical signal information of all cells in each traction battery, where the voltages (the cell voltages of all the cells) of the traction battery that are collected in the process of charging at least include terminal voltages, ohmic polarization, and concentration polarization/electrochemical polarization, and the like. After the charging is completed and a current is cut off, the traction battery takes a period of time to eliminate polarization effects from it (that is, to be depolarized). After that, the traction battery recovers with a terminal voltage corresponding to the state of charge (SOC). A time length of this process, that is, the specific period of time for the depolarization (referred to as the depolarization duration t_polarization below) is related to factors such as designs, structures, and charging currents of different batteries. FIG. 2 is a schematic diagram of a change curve of voltages of different traction batteries after being charged according to an embodiment of the solutions of the disclosure. The longitudinal axis represents a single-cell voltage (referred to as cell voltage below) of a cell in a traction battery, and the horizontal axis represents a time for monitoring self-discharge of the traction battery when the power battery is static and not in use. It is assumed that a moment t0 is an initial moment at which charging stops, and a moment t1 after a period of time is a moment at which a first phase starts and the depolarization is completed, that is, the depolarization is completed within the period of time from t0 to t1. It may be set that t1>t0+t_polarization. In an example, first, charging tests are conducted on batteries of various types/with various specifications, and depolarization duration "t_polarization" corresponding to the batteries of each type/with each specification is obtained based on test results. Then, in actual application, corresponding t_polarization is obtained directly based on a battery type/specifications, and t1 is set according to the rule "t1>t0+t_polarization". Since electrical signal information of self-discharge of traction batteries is collected in real time and uploaded synchronously to the cloud for storage, a server or the like on the cloud may perform observation and calculation for each corresponding traction battery stepwise in multiple phases, to ensure accurate calculation while taking operational efficiency of a battery swap station into account (that is, a traction battery that does not have a great risk of internal short circuit may be directly provided for electric vehicles).

First, a first phase of self-discharge observation and calculation is performed. After depolarization of a traction battery is completed, a voltage of the traction battery is basically stable and does not change within a short period of time, for example, 7 days, referring to Type 1 shown in FIG. 2. However, if there is a severe internal short circuit, the voltage decreases rapidly, referring to Type 3 shown in FIG. 2. A self-discharge rate of a traction battery may be calculated and determined by observing self-discharge of any cell in the traction battery, that is, a change of a cell voltage as a function of time.

In an embodiment, a principle of the observation and calculation is: an internal short circuit situation of a traction battery may be evaluated by calculating a voltage change after the moment t1; it is assumed that a voltage of a cell j in a traction battery 1 at the moment t1 is v_1j, and at a moment a period of time after the moment t1, for example, at a moment ti, the traction battery is within duration P1_time of the first phase of self-discharge observation, and a voltage of the cell j at the moment ti is v_ij; and a self-discharge rate of a traction battery may be calculated based on observation of a cell in the traction battery, for example, based on observation and calculation of a voltage change of the cell j from the moment t1 to the moment ti a period of time after the moment t1, where the time period ti−t1 is within the duration P1_time of the first phase of self-discharge observation and calculation, where i means the $j^{th}$ and is a natural number greater than 1; and j means the $j^{th}$ and is a natural number greater than or equal to 1. A value range of P1_time may be 1 hour to 24 hours. For example, P1_time may be set to 2 hours, 1 hour, or the like according to requirements. Specifically, a first-phase self-discharge rate p1Sdr is calculated according to the foregoing observation and calculation principle, as shown in formula 1.

$$p1Sdr = \left| \frac{v_{i,j} - v_{1,j}}{t_{i,j} - t_{1,j}} \right|, \qquad \text{Formula 1}$$

where $v_{i,j}$ represents a cell voltage of the cell j at the moment ti, $v_{1,j}$ represents a cell voltage of the cell j at the moment t1, $t_{i,j}$ represents the moment ti related to the cell j, and $t_{1,j}$ represents the moment t1 related to the cell j. Herein, duration ti−t1 is within P1_time, and ti<t1+P1_time. Further, there is a need to calculate an absolute value of a result of formula 1 in the observation and calculation principle. As shown in FIG. 2, the observed voltage change curve is decreasing, and a voltage at a current moment is usually less than a voltage at a previous moment. Therefore, the calculated self-discharge rate p1Sdr may be analyzed and observed. More specifically, the stepwise and phased observation and calculation of the battery self-discharge rate p1Sdr may be performed in the following specific manners:

(a) If ti<t1+P1_time, the time period from t1 to ti may be selected for performing the first phase of observation and calculation, and the first-phase self-discharge rate p1Sdr is obtained according to formula 2:

$$p1Sdr = \left| \frac{v_{t_i,j} - v_{t_1,j}}{t_{t_i,j} - t_{t_1,j}} \right|. \qquad \text{Formula 2}$$

Herein, ti<t1+P1_time, ti represents a time point at which the first phase of voltage self-discharge observation ends and is a time point in the past, and the time period from t1 to ti for observation is within the duration P1_time of the first phase of self-discharge observation and calculation, that is, shorter than the duration of the first phase. In this case, voltages in a time period from t1 to t1+P1_time may be selected for analysis.

$t_{t_i,j}$ represents a time point (moment) t_i that is selected from the time period from t1 to t1+P1_time for the observation of a cell voltage of the cell j, and in this case, the corresponding voltage of the cell j is $v_{t_i,j}$; and $t_{t_1,j}$ represents the time point (moment) t1, earlier than $t_{t_i,j}$, that is selected from the time period from t1 to t1+P1_time as a starting time for the observation of a cell voltage of the cell j, and in this case, the corresponding cell voltage of the cell j is $v_{t_1,j}$.

Further, if calculated p1Sdr is greater than s1 (a first threshold), it is determined that there is a serious micro-internal short circuit in the cell j. Therefore, the traction battery where the cell j is located has a relatively high risk of internal short circuit, cannot be directly allocated to an electric vehicle for use and needs to be retained, and requires a second phase of self-discharge observation and calculation. However, if the calculated p1Sdr is not greater than the first threshold s1, for example, if p1Sdr≤s1, it is determined that there is no micro-internal short circuit in the cell j. Therefore, the traction battery where the cell j is located has a relatively low risk of internal short circuit belonging to the normal range, and may be normally swapped for use by an electric vehicle when needed. A value range of s1 may be 0.1 to 100.

Further, after completing the observation and the calculation, the cloud may feed back a result (including a case where the battery is normal and a case where the battery is retained for further observation in a next phase) to each battery swap station.

(b) If ti>t1+P1_time, the self-discharge rate p1Sdr within the duration P1_time is calculated by using the sliding window method. For example, the observation and the calculation are performed on cell voltages within the time period from ti to ti+P1_time. The first-phase self-discharge rate p1Sdr is calculated according to formula 3:

$$p1Sdr = \left| \frac{v_{t_i,j} - v_{t_i-P1_{time},j}}{t_{t_i,j} - t_{t_i-P1_{time},j}} \right|. \qquad \text{Formula 3}$$

Herein, ti>t1+P1_time, ti represents a time point at which the first phase of voltage self-discharge observation ends and is a time point in the past, and the time period from t1 to ti for observation is beyond the duration P1_time of the first phase of self-discharge observation and calculation, that is, longer than the duration of the first phase. In this case, the sliding window is slid through the moment t1 to select voltages within the time period from ti to ti+P1_time for analysis.

$t_{t_i,j}$ represents a time point (moment) ti that is selected from the time period from ti to ti+P1_time for the observation of a cell voltage of the cell j, and in this case, the corresponding voltage of the cell j is $v_{t_i,j}$; and $t_{t_i-P1\_time,j}$ represents the time point (moment) $t_i$−P1_time, earlier than $t_{t_i,j}$, that is selected from the time period from ti to ti+P1_time as a starting time for the observation of a cell voltage of the cell j, and in this case, the corresponding cell voltage of the cell j is $v_{t_i-P1\_time,j}$.

Further, if calculated p1Sdr is greater than s1 (a first threshold), it is determined that there is a serious micro-internal short circuit in the cell j. Therefore, the traction battery where the cell j is located has a relatively high risk of internal short circuit, cannot be directly allocated to an electric vehicle for use and needs to be retained, and requires a second phase of self-discharge observation and calculation. If the calculated p1Sdr is not greater than the first threshold s1, for example, if p1Sdr≤s1, it is determined that there is no micro-internal short circuit in the cell j. Therefore, the traction battery where the cell j is located has a relatively low risk of internal short circuit belonging to the normal range, and may be normally swapped for use by an electric vehicle when needed. A value range of s1 may be 0.1 to 100.

Further, after completing the observation and the calculation, the cloud may feed back a result (including a case where the battery is normal and a case where the battery is retained for further observation in a next phase) to each battery swap station.

The sliding window calculation method used in (b) can help to accurately calculate a trend change of a monotonic change curve, which saves computing resources on the cloud, and improves computing efficiency.

Second, a second phase of self-discharge observation and calculation is performed. Duration P2_time of the second phase of observation and calculation is longer and a traction battery that is determined as having a high risk of internal short circuit in the first phase is mainly observed in the second phase. A manner of observing and calculating the self-discharge rate p2Sdr is similar to that in the first phase.

In an example, the duration P2_time may be set to n times as long as P1_time, and a value of n ranges from 2 to 10. In this phase, the second-phase self-discharge rate p2Sdr is observed and calculated according to formula 4:

$$p2Sdr = \left| \frac{v_{i+P2_{time},j} - v_{i,j}}{t_{i+P2_{time},j} - t_{i,j}} \right|,$$ Formula 4 where $t_{i+P2\_time,j}$ represents a time point (moment) $t_{i+P2\_time}$, for observation of a cell voltage of the cell j, that is selected from the time period from the moment ti at which the second phase starts to ti+P2_time, and in this case, the corresponding voltage of the cell j is $v_{i+P2\_time,j}$; and $t_{i,j}$ represents a time point (moment) $t_i$, earlier than $t_{i+P2\_time}$, that is selected from the time period from ti to ti+P2_time as a starting time for the observation of a cell voltage of the cell j, and in this case, the corresponding cell voltage of the cell j is $v_{i,j}$.

Further, if calculated p2Sdr is greater than s2 (a second threshold), it is determined that there is a serious micro-internal short circuit in the cell j. Therefore, the traction battery where the cell j is located has a relatively high risk of internal short circuit and cannot be directly allocated to an electric vehicle for use, and it is determined to trigger subsequent handling for the traction battery such as giving an alarm, stopping usage of the traction battery, and initiating a return and repair process. If the calculated p2Sdr is not greater than the second threshold s2, for example, p2Sdr≤s2, it is determined that there is no micro-internal short circuit in the cell j. Therefore, the traction battery where the cell j is located has a relatively low risk of internal short circuit belonging to the normal range, and may be normally swapped for use by an electric vehicle when needed. A value range of s2 may be 0.1 to 100.

It may be preset that s1 is greater than s2 that is greater than a specific value of a self-discharge rate of a cell.

Still further, a self-discharge rate sdr of a traction battery may be calculated by using a linear fitting method to replace a calculation manner in each phase. In other words, the linear fitting method is used for calculation in both the first phase and the second phase. For example, in the linear fitting method, a linear fitting calculation is performed on all voltages of a cell j in a traction battery that are obtained within a specific time period, and a slope is used as the self-discharge rate sdr, that is, sdr=k. A linear fitting formula is as shown in formula 5:

$$v\hat{} = v_0 + kt_i$$ Formula 5, where v^ represents all the voltages of the cell j within the specific time period, $v_0$ represents an initial voltage at a starting time of this period, and $t_i$ represents an ending time point of this period.

Similarly, a result of k, namely, the self-discharge rate sdr (for example, sdr1 and sdr2) may be compared with s1 and s2, respectively. For example: In the first phase, the calculated self-discharge rate sdr1 is greater than s1. In this case, further observation in the second phase is required; and if sdr2 calculated in the second phase is greater than s2, subsequent handling such as giving an alarm is triggered; or if sdr2 is not greater than s2, it indicates that the traction battery is normal. However, if sdr1 in the first phase is not greater than s1, it indicates that the traction battery is normal. In other words, a manner of observing, analyzing, comparing, and determining is the same as that in the first phase and the second phase described above, but a manner of calculating the self-discharge rate sdr1 in the first phase and sdr2 in the second phase is simpler except that the accuracy is relatively low.

Further, after completing the observation and the calculation, the cloud may feed back a result to each battery swap station. In a case where a traction battery has a risk of internal short circuit, as shown in FIG. 1, a server on the cloud feeds back a result to each battery swap station after completing the calculation, to trigger subsequent handling for one or more corresponding traction batteries in each battery swap station, where the subsequent handling includes giving an alarm, stopping usage of the traction battery, and initiating a return and repair process.

Figure 3:
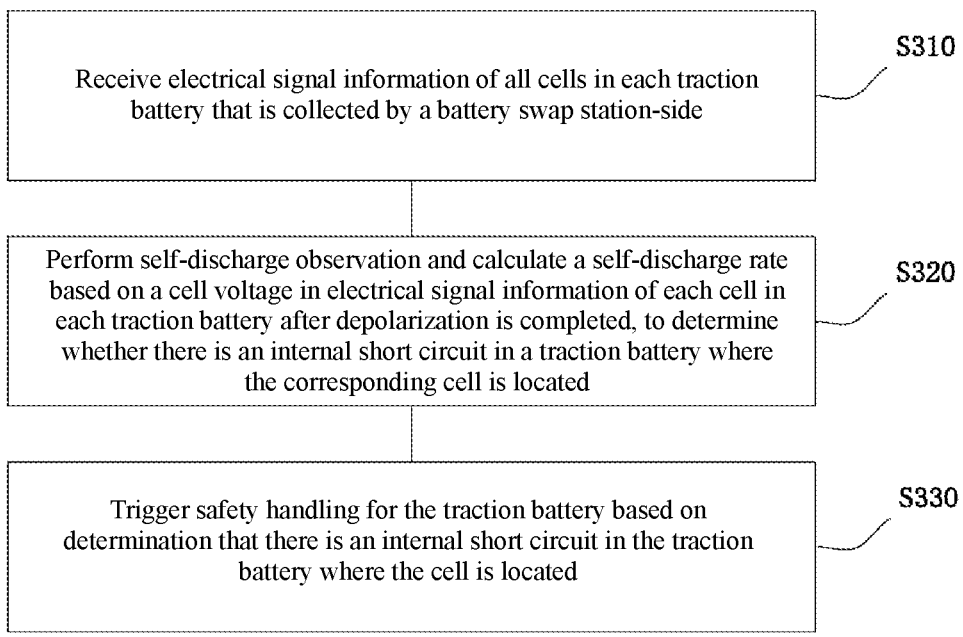
FIG. 3 is a schematic flowchart of main steps of a method for monitoring a battery short circuit according to an embodiment of the disclosure.

FIG. 3 is a schematic flowchart of main steps of a method for monitoring a battery short circuit according to an embodiment of the disclosure. In this embodiment, at least the following steps are included:

Step S310: Receive collected electrical signal information of all cells in each traction battery.

In an embodiment, the traction battery is stored statically in a battery swap station, and the battery swap station-side charges each traction battery stored in the battery swap station; and after being charged, the traction battery is stored statically in the battery swap station before being provided for an electric vehicle. During the charging and after the charging ends/the charging is completed, the battery swap station-side may use a data acquisition apparatus to collect electrical signal information of each traction battery stored statically in the battery swap station. Specifically, for example, in the battery swap station, a computer having a sensor for collecting data may monitor a condition of each traction battery; and a single-cell voltage, a current, a temperature, a state of charge (SOC), and other electrical signal information of all cells in each traction battery are collected in real time in a case where the traction battery is in a static state during the charging or after the charging is completed, and the information is uploaded synchronously in real time to the cloud connected to the battery swap station, and is received and stored by a storage device on the cloud. In an example, the electrical signal information may be stored based on a collection time for each cell in each traction battery.

Monitoring of a micro-internal short circuit in a traction battery requires the most accurate data, and the most accurate data may be obtained by monitoring and determining a voltage drop rate of the traction battery when it is in a static state for a period of time. In this way, whether there is an internal short circuit in the traction battery is determined. Based on a static scenario of a battery swap station, and in a working condition in which a traction battery is not interfered with by other vehicle-mounted devices, can be stored statically for a long time, and can be monitored continuously in real time, electrical signal information of the traction battery can be obtained accurately, so that data for subsequent self-discharge observation and self-discharge rate calculation designed according to a phased algorithm is more substantial and accurate, thereby improving accuracy of calculating the self-discharge rate and further helping to accurately determine an internal short circuit situation of the traction battery. In addition, in the prior art, calculation of a self-discharge rate of a traction battery requires removing it from a vehicle, which requires high costs. However, for a battery exchange system with battery swap stations, data monitoring and calculation are performed during storage of a battery in the battery swap station, which greatly reduces costs.

Step S320: Perform self-discharge observation and calculate a self-discharge rate based on a cell voltage in electrical signal information of each cell in each traction battery after depolarization is completed, to determine whether there is an internal short circuit in the traction battery where the corresponding cell is located.

In an implementation, through the main design of phased calculation, and with the utilization of the cloud where a huge amount of long-term data of a traction battery can be stored, a self-discharge rate of the battery can be calculated accurately based on these data, and a status of the battery, for example, whether there is a short circuit in the battery, can be determined subsequently. In addition, during the calculation, a manner of the calculation is improved. In a multi-phase and stepwise manner, for example, in the manner in the foregoing two phases, operational efficiency of a battery swap station can be ensured while taking calculation accuracy into account, that is, a battery whose self-discharge rate does not exceed the threshold in the first phase can be transferred directly and provided for an electric vehicle that requires a battery.

Figure 4:
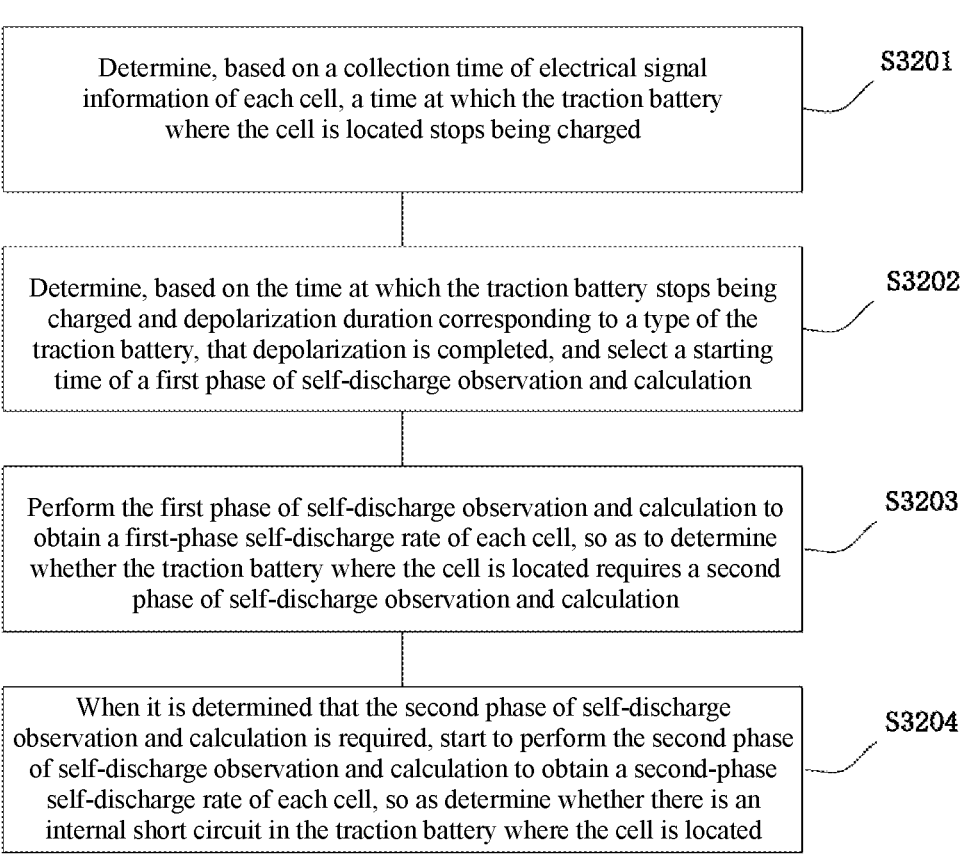
FIG. 4 is a schematic flowchart of main steps of a procedure of calculating a self-discharge rate according to an embodiment of the method of the disclosure.

In an embodiment, FIG. 4 is a schematic flowchart of main steps of a procedure of calculating a self-discharge rate according to an embodiment of the method of the disclosure.

Step S3201: Determine, based on the collection time of the electrical signal information of each cell, a time at which the traction battery where the cell is located stops being charged.

In an example, the electrical signal information of each cell is uploaded, based on a time at which the information is collected in real time, synchronously to the cloud for corresponding storage. In other words, the electrical signal information of each cell corresponds to a collection time of the information. Further, in an example, a time point at which currents of all the cells (that is, of the corresponding traction battery) are 0 may be found in the electrical signal information based on a sequence of the collection time and used as the moment t0 at which the battery stops being charged.

Step S3202: Select, based on the time at which the traction battery stops being charged and depolarization duration corresponding to a type of the traction battery, a starting time of the first phase of self-discharge observation and calculation on the cell voltage in corresponding electrical signal information of each cell in the traction battery;

Specifically, first, duration for completing the depolarization of the traction battery may be set based on the time at which the traction battery stops being charged and the depolarization duration (t_polarization) corresponding to the type of the traction battery. In an embodiment, because during charging of a traction battery, in addition to a terminal voltage, a cell voltage further includes ohmic polarization, concentration polarization/electrochemical polarization, and the like. Once the charging is completed and after a current is cut off, the traction battery takes a period of time to eliminate polarization effects from it. Therefore, after the charging is completed, the traction battery requires a period of time for depolarization. A length of the duration t_polarization is related to factors such as designs, structures, and charging currents of different batteries. Referring to a voltage change curve shown in FIG. 2, the charging stops at to, and the depolarization is completed at t1. Usually, it is required that t1>t0+t_polarization, that is, it is required that depolarization be fully completed. In an example, for traction batteries of different types or with different specifications, a depolarization time period, namely the depolarization duration t_polarization corresponding to a traction battery of each type/with each set of specifications may be obtained based on accumulated test results that are obtained by carrying out charging tests on the traction battery of each type/with each set of specifications, and is recorded as a fixed parameter of the traction battery of the corresponding type/with the corresponding set of specifications. In other words, depolarization duration t_polarization of a traction battery can be obtained by obtaining a type/specifications (for example, a model serial number) of the traction battery. Then, minimum duration for completing the depolarization is finally determined to be t0+t_polarization based on the principle of t1>t0+t_polarization and actual requirements in combination with t0 that has been determined. In this way, a suitable collection time corresponding to the electrical signal information of each cell may be selected as the starting time t1 of the first phase of self-discharge observation and calculation. For example, Depolarization duration t_polarization of a traction battery i of a model R in a battery swap station 1 is 2 hours, and t0 is 14:00 on Jan. 2, 2020. In this case, it may be determined that a time after 16:00, for example, t1 that is 16:30 on Jan. 2, 2020, may be used as a starting time of the first phase of self-discharge observation and calculation for the traction battery i after the depolarization of the traction battery i is completed. In other words, depolarization of the traction battery i of the model R in the battery swap station is completed at 16:30 on this day, and this time may be the starting time of the first phase of self-discharge observation and calculation for the traction battery i.

Step S3203: Perform the first phase of self-discharge observation and calculation on the cell voltage in the electrical signal information of each cell in each traction battery from the selected starting time of the first phase of self-discharge observation and calculation to obtain a first-phase self-discharge rate (p1Sdr) of each cell, so as to determine whether to perform a second phase of self-discharge observation and calculation for the traction battery where the cell is located.

In an embodiment, a huge amount of electrical signal information of all cells in a traction battery uploaded by a battery swap station is stored on the cloud. The electrical signal information of each cell at least includes a corresponding cell voltage of the cell at a time point/moment. After depolarization of a traction battery is completed, a voltage of the traction battery is basically stable and does not change within a short period of time, for example, 7 days, referring to Type 1 shown in FIG. 2. However, if there is an internal short circuit, the voltage decreases rapidly, referring to Type 3 shown in FIG. 2. Therefore, whether there is an internal short circuit in the battery may be evaluated by calculating a voltage change after the selected starting time t1, after the depolarization is completed, of the first phase of self-discharge observation and calculation.

A principle of the observation and the calculation is: an internal short circuit situation of a traction battery may be evaluated by calculating a voltage change after the moment t1; it is assumed that a voltage of a cell j in a traction battery 1 at the moment t1 is v_1j, and at a moment a period of time after the moment t1, for example, at a moment ti, the traction battery is within duration P1_time of the first phase of self-discharge observation, and a voltage of the cell j at the moment ti is v_ij; and a self-discharge rate of a traction battery may be calculated based on observation of a cell in the traction battery, for example, based on observation and calculation of a voltage change of the cell j from the moment t1 to the moment ti a period of time after the moment t1, where the time period ti−t1 is within the duration P1_time of the first phase of self-discharge observation and calculation, where i means the $j^{th}$ and is a natural number greater than 1; and j means the $j^{th}$ and is a natural number greater than or equal to 1. A value range of P1_time may be 1 hour to 24 hours. For example, P1_time may be set to 2 hours, 1 hour, or the like according to requirements. Specifically, a first-phase self-discharge rate p1Sdr is calculated according to the foregoing observation and calculation principle, as shown in formula 1:

$$p1Sdr = \left| \frac{v_{i,j} - v_{1,j}}{t_{i,j} - t_{1,j}} \right|, \quad \text{Formula 1}$$

where $v_{i,j}$ represents a cell voltage of the cell j at the moment ti, $v_{1,j}$ represents a cell voltage of the cell j at the moment t1, $t_{i,j}$ represents the moment ti related to the cell j, and $t_{1,j}$ represents the moment t1 related to the cell j. Herein, duration ti−t1 is within P1_time, and ti<t1+P1_time. Further, an absolute value of a result of formula 1 in the observation and calculation principle is used as the final result. As shown in FIG. 2, the observed voltage change curve is decreasing, and a voltage at a current moment is usually less than a voltage at a previous moment. Therefore, the calculated self-discharge rate p1Sdr may be analyzed and observed.

According to the foregoing principle, in an embodiment, observation is performed from t1 to ti, and calculation is performed based on the following cases.

(a) If ti<t1+P1_time, the time period from t1 to ti may be selected for performing the first phase of observation and calculation, and the first-phase self-discharge rate p1Sdr is obtained according to formula 2:

$$p1Sdr = \left| \frac{v_{t_i,j} - v_{t_1,j}}{t_{t_i,j} - t_{t_1,j}} \right|. \quad \text{Formula 2}$$

Herein, ti<t1+P1_time, ti represents a time point at which the first phase of voltage self-discharge observation ends and is a time point in the past, and the time period from t1 to ti for observation is within the duration P1_time of the first phase of self-discharge observation and calculation, that is, shorter than the duration of the first phase. In this case, voltages in a time period from t1 to t1+P1_time may be selected for analysis.

$t_{t_i,j}$ represents a time point (moment) ti that is selected from the time period from t1 to t1+P1_time for the observation of a cell voltage of the cell j, and in this case, the corresponding voltage of the cell j is $v_{t_i,j}$; and $t_{t_1,j}$ represents the time point (moment) t_1, earlier than $t_{t_i,j}$, that is selected from the time period from t1 to t1+P1_time as a starting time for the observation of a cell voltage of the cell j, and in this case, the corresponding cell voltage of the cell j is $v_{t_1,j}$.

Example 1: P1_time is 1 hour, t_polarization is 2 hours, a time t0 at which a traction battery stops being charged is 13:00, a starting time of the first phase (a period 1) is selected as t1, t1 is 16:00, and t1−t0>2 indicates that selected t1 is a time point after depolarization is completed. If ti<t1+1, for example, ti is 16:30, a cell voltage of each corresponding cell in the traction battery within a time period from t1 to t1+1, for example, corresponding cell voltages of any cell j at various time points within a time period from 16:00 to 17:00, may be extracted for analysis. For example, $t_{t\_i,j}$ is 16:50, $t_{t\_1,j}$ is 16:00, a corresponding cell voltage $v_{t\_i,j}$ at 16:50 is 1, a cell voltage $v_{t\_1,j}$ at 16:00 is 1.01, and p1Sdr is 0.012.

Further, if calculated p1Sdr is greater than s1 (a first threshold), it is determined that there is a serious micro-internal short circuit in the cell j. Therefore, the traction battery where the cell j is located has a relatively high risk of internal short circuit, cannot be directly allocated to an electric vehicle for use and needs to be retained, and requires a second phase of self-discharge observation and calculation. However, if the calculated p1Sdr is not greater than the first threshold s1, for example, if p1Sdr≤s1, it is determined that there is no micro-internal short circuit in the cell j. Therefore, the traction battery where the cell j is located has a relatively low risk of internal short circuit belonging to the normal range, and may be normally swapped for use by an electric vehicle when needed. A value range of s1 may be 0.1 to 100. Example 1 is still used: p1Sdr is 0.012, s1 is 0.2, and 0.012<s1. In this case, the battery is allowed for normal exchange. If p1Sdr is 0.3, and 0.3>s1, a period 2 is triggered. In other words, if cell voltages of all cells in a traction battery do not indicate p1Sdr>s1 in the first phase of self-discharge observation and calculation (the period 1), the second phase of self-discharge observation and calculation is not triggered; or, if a cell voltage of any cell in the traction battery indicates p1Sdr>s1 in the period 1, it is considered that there is a micro-internal short circuit in the traction battery, which is highly risky, and the second phase of self-discharge observation and calculation (the period 2) is triggered.

Further, after completing the observation and the calculation, the cloud may feed back a result (including a case where the battery is normal and a case where the battery is retained for further observation in a next phase) to each battery swap station.

(b) If ti>t1+P1_time, the self-discharge rate p1Sdr within the duration P1_time is calculated by using the sliding window method. For example, the observation and the calculation are performed on cell voltages within the time period from ti to ti+P1_time. The first-phase self-discharge rate p1Sdr is calculated according to formula 3:

$$p1Sdr = \left| \frac{v_{t_i,j} - v_{t_i-P1_{time},j}}{t_{t_i,j} - t_{t_i-P1_{time},j}} \right|. \quad \text{Formula 3}$$

Herein, ti>t1+P1_time, ti represents a time point at which the first phase of voltage self-discharge observation ends and is a time point in the past, and the time period from t1 to ti for observation is beyond the duration P1_time of the first phase of self-discharge observation and calculation, that is, longer than the duration of the first phase. In this case, the sliding window is slid through the moment t1 to select voltages within the time period from ti to ti+P1_time for analysis.

$t_{i,j}$ represents a time point (moment) t_i that is selected from the time period from ti to ti+P1_time for the observation of a cell voltage of the cell j, and in this case, the corresponding voltage of the cell j is $v_{t_i,j}$; and $t_{t_i-P1\_time,j}$ represents the time point (moment) ti−P1_time, earlier than $t_{i,j}$, that is selected from the time period from ti to ti+P1_time as a starting time for the observation of a cell voltage of the cell j, and in this case, the corresponding cell voltage of the cell j is $v_{t_i-P1\_time,j}$.

Example 2: P1_time is 1 hour, t_polarization is 2 hours, a time t0 at which a traction battery stops being charged is 13:00, a starting time of the first phase (a period 1) is selected as t1, t1 is 16:00, and t1−t0>2 indicates that selected t1 is a time point after depolarization is completed. If ti>t1+1, for example, when ti is 17:10, a cell voltage of each corresponding cell in the traction battery within a time period from ti to ti+1, for example, corresponding cell voltages of any cell j in the traction battery at various time points within a time period from 17:30 to 18:30, may be extracted for analysis. For example, to is 18:30, $t_{t_i-P1\_time,j}$ is 17:40, a corresponding cell voltage $v_{t\_i,j}$ at 18:30 is 1, a cell voltage $v_{t_i-P1\_time,j}$ at 17:40 is 1.3, and p1Sdr is 0.36.

Further, if calculated p1Sdr is greater than s1 (a first threshold), it is determined that there is a serious micro-internal short circuit in the cell j. Therefore, the traction battery where the cell j is located has a relatively high risk of internal short circuit, cannot be directly allocated to an electric vehicle for use and needs to be retained, and requires a second phase of self-discharge observation and calculation. If the calculated p1Sdr is not greater than the first threshold s1, for example, if p1Sdr≤s1, it is determined that there is no micro-internal short circuit in the cell j. Therefore, the traction battery where the cell j is located has a relatively low risk of internal short circuit belonging to the normal range, and may be normally swapped for use by an electric vehicle when needed. A value range of s1 may be 0.1 to 100. Example 2 is still used: p1Sdr is 0.36, s1 is 0.2, and 0.36>s1. In this case, the period 2 is triggered. If p1Sdr is 0.1, and 0.1<s1, the battery is allowed for normal exchange. In other words, if cell voltages of all cells in a traction battery do not indicate p1Sdr>s1 in the first phase of self-discharge observation and calculation (the period 1), the second phase of self-discharge observation and calculation is not triggered; or, if a cell voltage of any cell in the traction battery indicates p1Sdr>s1 in the period 1, it is considered that there is a micro-internal short circuit in the traction battery, which is highly risky, and the second phase of self-discharge observation and calculation (the period 2) is triggered.

Further, after completing the observation and the calculation, the cloud may feed back a result (including a case where the battery is normal and a case where the battery is retained for further observation in a next phase) to each battery swap station.

The sliding window calculation method used in (b) can help to accurately calculate a trend change of a monotonic change curve, which saves computing resources on the cloud, and improves computing efficiency.

Still further, a self-discharge rate sdr of a traction battery may be calculated by using a linear fitting method to replace a calculation manner in each phase. In other words, the linear fitting method is used for calculation in the period 1. For example, in the linear fitting method, a linear fitting calculation is performed on cell voltages of any cell j of all cells in a traction battery that are obtained within a specific time period, and a slope is used as the self-discharge rate sdr1, that is, sdr=k. A linear fitting formula is as shown in formula 5:

$$v\hat{} = v_0 + kt_i \qquad \text{Formula 5,}$$

where v^ represents all the voltages of the cell j within the specific time period, $v_0$ represents an initial voltage at a starting time of this period, and $t_i$ represents an ending time point of this period.

Similarly, a result of k, namely, the self-discharge rate sdr1, may be compared with s1. For example, in the period 1, the calculated self-discharge rate sdr1 is greater than s1, and in this case, the traction battery requires further observation in the second phase, namely the period 2; or, if the calculated self-discharge rate sdr1 is not greater than s1, there is no voltage change in the cell, that is, the self-discharge rate sdr1 is not greater than s1, and in this case, the traction battery is allowed for normal exchange.

Step S3204: When it is determined that the traction battery where the cell is located requires the second phase of self-discharge observation and calculation, select a time, with duration (P2_time) greater than that of the first phase of self-discharge observation and calculation after the first phase of self-discharge observation and calculation is completed, as a starting time of the second phase of self-discharge observation and calculation on the cell voltage of each cell in the traction battery to obtain a second-phase self-discharge rate (p2Sdr) of each cell, so as to determine whether there is an internal short circuit in the traction battery where the cell is located.

Specifically, the second phase of self-discharge observation and calculation (the period 2) is required for a traction battery that is determined as having a high risk of internal short circuit in the period 1. A time point after completion of the first phase for the traction battery where the cell is located, for example, t2 or t3 shown in FIG. 2, is selected as the starting time of the second phase. In addition, a manner of obtaining the self-discharge rate p2Sdr in the second phase of self-discharge observation and calculation is similar to that in the first phase.

In an example, the duration P2_time may be set to n times as long as P1_time, and a value of n ranges from 2 to 10. In this phase, the second-phase self-discharge rate p2Sdr is observed and calculated according to formula 4:

$$p2Sdr = \left| \frac{v_{i+P2_{time},j} - v_{i,j}}{t_{i+P2_{time},j} - t_{i,j}} \right|, \qquad \text{Formula 4}$$

where $t_{i+P2\_time,j}$ represents a time point (moment) $t_{i+P2\_time}$ that is selected from the time period from the moment ti after the second phase starts to ti+P2_time for observation of a cell voltage of the cell j, and in this case, the corresponding voltage of the cell j is $v_{i+P2\_time,j}$ and $t_{i,j}$ represents a time point (moment) $t_i$, earlier than $t_{i+P2\_time}$, that is selected from the time period from the moment ti after the second phase starts to ti+P2_time as a starting time for the observation of a cell voltage of the cell j, and in this case, the corresponding cell voltage of the cell j is $v_{i,j}$. For an example of calculation, refer to Example 1 or Example 2 in (a) or (b).

Further, if calculated p2Sdr is greater than s2 (a second threshold), it is determined that there is a serious micro-internal short circuit in the cell j. Therefore, the traction battery where the cell j is located has a relatively high risk of internal short circuit and cannot be directly allocated to an electric vehicle for use, and it is determined to trigger subsequent handling for the traction battery such as giving an alarm, stopping usage of the traction battery, and initiating a return and repair process. If the calculated p2Sdr is not greater than the second threshold s2, for example, p2Sdr≤s2, it is determined that there is no micro-internal short circuit in the cell j. When all cells in the traction battery where the cell j is located do not indicate p2Sdr>s2, it indicates that the traction battery has a relatively low risk of internal short circuit belonging to a normal range, and may be normally swapped for use by an electric vehicle when needed. A value range of s2 may be 0.1 to 100.

It may be preset that s1 is greater than s2 that is greater than a specific value of a self-discharge rate of a cell.

Still further, a second-phase self-discharge rate sdr2 of a traction battery may be calculated by using a linear fitting method to replace a calculation method in each phase. In other words, the linear fitting method is used for calculation in the second phase. For example, in the linear fitting method, a linear fitting calculation is performed on all voltages of a cell j in a traction battery that are obtained within a specific time period, and a slope is used as the self-discharge rate sdr2, that is, sdr2=k. A linear fitting formula is as shown in formula 5:

$$v\hat{} = v_0 + kt_i \quad \text{Formula 5,}$$

where $v\hat{}$ represents all the voltages of the cell j within the specific time period, $v_0$ represents an initial voltage at a starting time of this period, and $t_i$ represents an ending time point of this period.

Similarly, a result of k, namely the self-discharge rate sdr2, may be compared with s2. For example, if sdr2 calculated in the second phase is greater than s2, subsequent handling such as giving an alarm is triggered; or if sdr2 is not greater than s2, it indicates that the traction battery is normal.

Through designs such as the multi-phase design and the sliding window method and calculations, computing resources, operational resources, and the like are saved. Further, the self-discharge calculation is performed in a shorter observation period 1 and a longer observation period 2, and observation in the period 2 is triggered by a result indicated in the period 1, such that some traction batteries having a relatively high risk are retained, thereby ensuring calculation accuracy without affecting battery exchange and operation of a whole battery swap station, that is, taking operation of the battery swap station into account.

Step S330: Trigger, based on determination that there is an internal short circuit in the traction battery where the cell is located, safety handling for the traction battery.

Specifically, for example, after completing the observation and the calculation, the cloud may feed back a result to each battery swap station. In a case where a traction battery has a risk of internal short circuit, as shown in FIG. 1, a server on the cloud feeds back a result to each battery swap station after completing the calculation, to trigger subsequent handling for one or more corresponding traction batteries in each battery swap station, namely the safety handling for the traction batteries, where the safety handling includes giving an alarm, stopping usage of the traction battery, and initiating a return and repair process. An alarm may be given in a manner of outputting alarm information or providing various alarm sounds and optical and/or electrical signals.

In another embodiment in the disclosure, calculation performed on the cloud for monitoring an internal short circuit in a traction battery may alternatively be performed by software in a local control device of each battery swap station.

It should be noted that, although the steps are described in a specific order in the foregoing embodiments, those skilled in the art can understand that in order to achieve the effects of the disclosure, different steps are not necessarily performed in such an order, but may be performed simultaneously (in parallel) or in other orders, and these changes shall all fall within the scope of protection of the disclosure.

Figure 5:
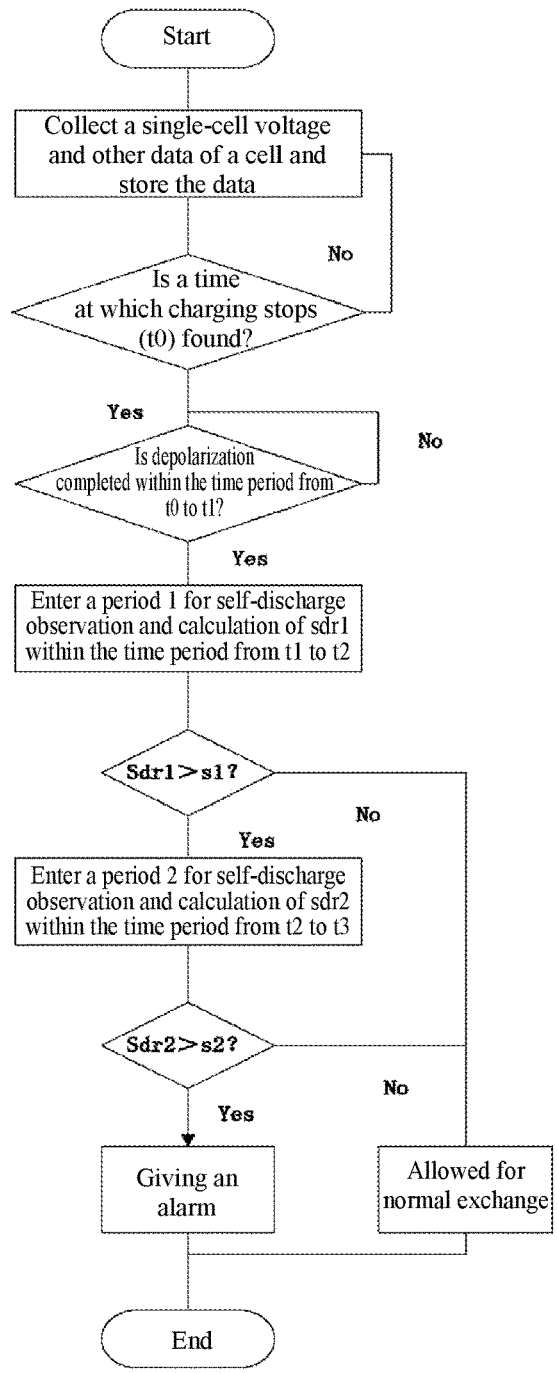
FIG. 5 is a flowchart of main steps of an application example of the method according to the disclosure.

The disclosure is further described in details with reference to FIG. 5. FIG. 5 is a flowchart of an example of application control in the method for monitoring a battery short circuit according to the disclosure.

Step 1: A battery swap station-side where traction batteries are statically stored collects signal information such as single-cell voltages, currents, temperatures, charges, and the like of all cells in each stored traction battery in a case where the traction battery remains static when being charged or after being charged, and uploads the information synchronously to the cloud or a local control device of the battery swap station in real time for storage and subsequent calculation. The cloud or control software of the battery swap station in another embodiment has a computing and data storage capability.

Step 2: Monitoring and calculation are performed on the cloud or by the local terminal based on the synchronously uploaded real-time information, where specifically, a time t0 at which charging of a traction battery ends (that is, when the traction battery stops being charged) is first determined. Whether to set a time as t0 can be determined by determining whether the charging ends at this time.

Step 3: When being stored statically in the battery swap station and not in use, the traction battery is depolarized after t0, monitoring is performed after t0, and when the monitoring continues until a time t1, whether t1−t0 is greater than duration t_polarization of the depolarization is determined. If t1−t0 is greater than the duration t_polarization, step 4 is performed for a first phase of self-discharge observation and calculation. If t1−t0 is not greater than the duration t_polarization, wait for completion of the depolarization to find the time point t1 when the depolarization is completed. The monitoring may be performed on the cloud or by the local control device.

Step 4: The first phase of self-discharge observation and calculation is performed (a period 1 is triggered), for example, from t1 to t2 as shown in FIG. 2, to calculate a change of a cell voltage of one or more cells in a traction battery in the period 1, that is, a self-discharge rate p1Sdr. The calculation is performed by a server on the cloud or a processing apparatus of the local control device.

Step 5: Whether p1Sdr/sdr1 is greater than a first threshold s1 is determined, and if p1Sdr/sdr1 is greater than s1, it is considered that there may be a micro-internal short circuit, therefore a traction battery where a cell corresponding to the self-discharge rate is located needs to be retained for a next phase of self-discharge observation and calculation, and step 6 is then performed; or if p1Sdr/sdr1 is not greater than s1, it is considered that there is not a micro-internal short circuit in a cell corresponding to the self-discharge rate, and when there is not a micro-internal short circuit in all cells in a traction battery, the traction battery is normal and allowed for exchange. A result of the calculation and determination is fed back on the cloud or by the local control device to the battery swap station.

Step 6: A second phase of observation and calculation is performed (a period 2 is triggered), for example, from t2 to t3 as shown in FIG. 2, for a traction battery, where a cell whose self-discharge rate is greater than s1 is located, determined through the first phase of observation and calculation. Duration of the period 2 is longer than the period 1, for example, is n times as long as the period 1. Similarly, a change of a cell voltage of one or more cells in the traction battery in the period 2, that is, a self-discharge rate p2Sdr/sdr2, is calculated after the second phase of observation and calculation. The monitoring and calculation are performed by the server on the cloud or the processing apparatus of the local control device.

Step 7: Whether p2Sdr is greater than a second threshold s2 is determined, and if p2Sdr is greater than s2, it is considered that there may be a micro-internal short circuit, and therefore various subsequent handling related to battery safety such as giving an alarm (for example, providing alarm information in step 8) needs to be performed for the traction battery where the cell corresponding to the self-discharge rate is located; or if p2Sdr is not greater than s2, it is considered that there is not a micro-internal short circuit in the cell corresponding to the self-discharge rate, and when there is not a micro-internal short circuit in all cells in the traction battery, the traction battery is normal and allowed for exchange. A result of the calculation and determination is fed back on the cloud or by the local control device to the battery swap station.

Step 8: Safety handling is performed, for example, an alarm is given, for the traction battery determined to have an internal short circuit after real-time monitoring. After obtaining the result that is fed back, the battery swap station triggers various types of handling, for example, safety handling (giving an alarm), for the corresponding traction battery. If the back-fed result obtained by the battery swap station in step 5 or step 7 indicates that there is no internal short circuit, the traction battery is allowed for normal exchange.

s1 is greater than s2 that is greater than a specified value of a self-discharge rate of the cell, and a value range of the first threshold s1 and the second threshold s2 is 0.1 to 100.

Figure 6:
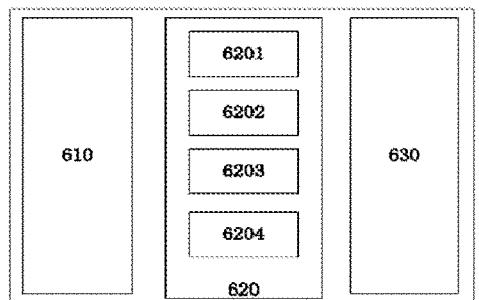
FIG. 6 is a block diagram of a structure of a system for monitoring a battery short circuit according to the disclosure.

FIG. 6 is a schematic diagram of a main structure of a system for monitoring a battery short circuit according to an embodiment of the disclosure. The system at least includes:

a receiving and storage apparatus 610 configured to receive collected electrical signal information of all cells in each traction battery. In an embodiment, the traction battery is stored statically in a battery swap station, and the battery swap station-side charges each traction battery stored in the battery swap station; and after being charged, the traction battery is stored statically in the battery swap station before being provided for an electric vehicle. During the charging and after the charging ends/the charging is completed, the battery swap station-side may use a data acquisition apparatus to collect electrical signal information of each traction battery stored statically in the battery swap station. Specifically, for example, in the battery swap station, a computer having a sensor for collecting data may monitor a condition of each traction battery; and a single-cell voltage, a current, a temperature, a state of charge (SOC), and other electrical signal information of all cells in each traction battery are collected in real time in a case where the traction battery is in a static state during the charging or after the charging is completed, and the information is uploaded synchronously in real time to the cloud connected to the battery swap station, and is received and stored by a storage device on the cloud. In an example, the electrical signal information may be stored based on a collection time for each cell in each traction battery. Monitoring of a micro-internal short circuit in a traction battery requires the most accurate data, and the most accurate data may be obtained by monitoring and determining a voltage drop rate of the traction battery when it is in a static state for a period of time. In this way, whether there is an internal short circuit in the traction battery is determined. Based on a static scenario of a battery swap station, and in a working condition in which a traction battery is not interfered with by other vehicle-mounted devices, can be stored statically for a long time, and can be monitored continuously in real time, electrical signal information of the traction battery can be obtained accurately, so that data for subsequent self-discharge observation and self-discharge rate calculation designed according to a phased algorithm is more substantial and accurate, thereby improving accuracy of calculating the self-discharge rate and further helping to accurately determine an internal short circuit situation of the traction battery. In addition, in the prior art, calculation of a self-discharge rate of a traction battery requires removing it from a vehicle, which requires high costs. However, for a battery exchange system with battery swap stations, data monitoring and calculation are performed during storage of a battery in the battery swap station, which greatly reduces costs.

The system further includes a phased-calculation apparatus 620 configured to perform self-discharge observation and calculate a self-discharge rate based on a cell voltage in electrical signal information of each cell in each traction battery after depolarization is completed, to determine whether there is an internal short circuit in the traction battery where the corresponding cell is located.

Through the main design of phased calculation, and with the utilization of the cloud where a huge amount of long-term data of a traction battery can be stored, the apparatus can accurately calculate a self-discharge rate of the battery based on these data, and determine a status of the battery subsequently, for example, determine whether there is a short circuit in the battery. In addition, during the calculation, a manner of the calculation is improved. In a multi-phase and stepwise manner, for example, in the manner in the foregoing two phases, operational efficiency of a battery swap station can be ensured while taking calculation accuracy into account, that is, a battery whose self-discharge rate does not exceed the threshold in the first phase can be transferred directly and provided for an electric vehicle that requires a battery.

In an embodiment, the phased-calculation apparatus 620 further includes:

a charging stop time apparatus 6201 configured to determine, based on the collection time of the electrical signal information of each cell, a time at which the traction battery where the cell is located stops being charged. In an example, the electrical signal information of each cell is uploaded, based on a time at which the information is collected in real time, synchronously to the cloud for corresponding storage. In other words, the electrical signal information of each cell corresponds to a collection time of the information. Further, in an example, a time point at which currents of all the cells (that is, of the corresponding traction battery) are 0 may be found in the electrical signal information based on a sequence of the collection time and used as the moment t0 at which the battery stops being charged.

The phased-calculation apparatus 620 further includes a first phase start selection apparatus 6202 configured to select, based on the time at which the traction battery stops being charged and depolarization duration corresponding to a type of the traction battery, a starting time of the first phase of self-discharge observation and calculation on the cell voltage in corresponding electrical signal information of each cell in the traction battery. Specifically, first, duration for completing the depolarization of the traction battery may be set based on the time at which the traction battery stops being charged and the depolarization duration (t_polarization) corresponding to the type of the traction battery. In an embodiment, because during charging of a traction battery, in addition to a terminal voltage, a cell voltage further includes ohmic polarization, concentration polarization/electrochemical polarization, and the like. Once the charging is completed and after a current is cut off, the traction battery takes a period of time to eliminate polarization effects from it. Therefore, after the charging is completed, the traction battery requires a period of time for depolarization. A length of the duration t_polarization is related to factors such as designs, structures, and charging currents of different batteries. Referring to a voltage change curve shown in FIG. 2, the charging stops at t0, and the depolarization is completed at t1. Usually, it is required that t1>t0+t_polarization, that is, it is required that depolarization be fully completed. In an example, for traction batteries of different types or with different specifications, a depolarization time period, namely the depolarization duration t_polarization corresponding to a traction battery of each type/with each set of specifications may be obtained based on accumulated test results that are obtained by carrying out charging tests on the traction battery of each type/with each set of specifications, and is recorded as a fixed parameter of the traction battery of the corresponding type/with the corresponding set of specifications. In other words, depolarization duration t_polarization of a traction battery can be obtained by obtaining a type/specifications (for example, a model serial number) of the traction battery. Then, minimum duration for completing the depolarization is finally determined to be t0+t_polarization based on the principle of t1>t0+t_polarization and actual requirements in combination with t0 that has been determined. In this way, a suitable collection time corresponding to the electrical signal information of each cell may be selected as the starting time t1 of the first phase of self-discharge observation and calculation. For example, Depolarization duration t_polarization of a traction battery i of a model R in a battery swap station 1 is 2 hours, and t0 is 14:00 on Jan. 2, 2020. In this case, it may be determined that a time after 16:00, for example, t1 that is 16:30 on Jan. 2, 2020, may be used as a starting time of the first phase of self-discharge observation and calculation for the traction battery i after the depolarization of the traction battery i is completed. In other words, depolarization of the traction battery i of the model R in the battery swap station is completed at 16:30 on this day, and this time may be the starting time of the first phase of self-discharge observation and calculation for the traction battery i.

The phased-calculation apparatus 620 further includes a first-phase calculation apparatus 6203 configured to perform the first phase of self-discharge observation and calculation on the cell voltage in the electrical signal information of each cell in each traction battery from the selected starting time of the first phase of self-discharge observation and calculation to obtain a first-phase self-discharge rate (p1Sdr) of each cell, so as to determine whether to perform a second phase of self-discharge observation and calculation for the traction battery where the cell is located. In an embodiment, a huge amount of electrical signal information of all cells in a traction battery uploaded by a battery swap station is stored on the cloud. The electrical signal information of each cell at least includes a corresponding cell voltage of the cell at a time point/moment. After depolarization of a traction battery is completed, a voltage of the traction battery is basically stable and does not change within a short period of time, for example, 7 days, referring to Type 1 shown in FIG. 2. However, if there is an internal short circuit, the voltage decreases rapidly, referring to Type 3 shown in FIG. 2. Therefore, whether there is an internal short circuit in the battery may be evaluated by calculating a voltage change after the selected starting time t1, after the depolarization is completed, of the first phase of self-discharge observation and calculation.

A principle of the observation and the calculation is: an internal short circuit situation of a traction battery may be evaluated by calculating a voltage change after the moment t1; it is assumed that a voltage of a cell j in a traction battery 1 at the moment t1 is v_1j, and at a moment a period of time after the moment t1, for example, at a moment ti, the traction battery is within duration P1_time of the first phase of self-discharge observation, and a voltage of the cell j at the moment ti is v_ij; and a self-discharge rate of a traction battery may be calculated based on observation of a cell in the traction battery, for example, based on observation and calculation of a voltage change of the cell j from the moment t1 to the moment ti a period of time after the moment t1, where the time period ti−t1 is within the duration P1_time of the first phase of self-discharge observation and calculation, where i means the $i^{th}$ and is a natural number greater than 1; and j means the $j^{th}$ and is a natural number greater than or equal to 1. A value range of P1_time may be 1 hour to 24 hours. For example, P1_time may be set to 2 hours, 1 hour, or the like according to requirements. Specifically, a first-phase self-discharge rate p1Sdr is calculated according to the foregoing observation and calculation principle, as shown in formula 1:

$$p1Sdr = \left| \frac{v_{i,j} - v_{1,j}}{t_{i,j} - t_{1,j}} \right|, \quad \text{Formula 1}$$

where $v_{i,j}$ represents a cell voltage of the cell j at the moment ti, $v_{1,j}$ represents a cell voltage of the cell j at the moment t1, $t_{i,j}$ represents the moment ti related to the cell j, and $t_{1,j}$ represents the moment t1 related to the cell j. Herein, duration ti−t1 is within P1_time, and ti<t1+P1_time. Further, an absolute value of a result of formula 1 in the observation and calculation principle may be calculated. As shown in FIG. 2, the observed voltage change curve is decreasing, and a voltage at a current moment is usually less than a voltage at a previous moment. Therefore, the calculated self-discharge rate p1Sdr may be analyzed and observed.

According to the foregoing principle, in an embodiment, observation is performed from t1 to ti, and calculation is performed based on the following cases.

(a) If ti<t1+P1_time, the time period from t1 to ti may be selected for performing the first phase of observation and calculation, and the first-phase self-discharge rate p1Sdr is obtained according to formula 2:

$$p1Sdr = \left| \frac{v_{t_i,j} - v_{t_1,j}}{t_{i,j} - t_{1,j}} \right|. \quad \text{Formula 2}$$

Herein, ti<t1+P1_time, ti represents a time point at which the first phase of voltage self-discharge observation ends and is a time point in the past, and the time period from t1 to ti for observation is within the duration P1_time of the first phase of self-discharge observation and calculation, that is, shorter than the duration of the first phase. In this case, voltages in a time period from t1 to t1+P1_time may be selected for analysis.

$t_{t_i,j}$ represents a time point (moment) ti that is selected from the time period from t1 to t1+P1_time for the observation of a cell voltage of the cell j, and in this case, the corresponding voltage of the cell j is $v_{t_i,j}$; and $t_{t_1,j}$ represents the time point (moment) t1, earlier than $t_{t_i,j}$, that is selected from the time period from t1 to t1+P1_time as a starting time for the observation of a cell voltage of the cell j, and in this case, the corresponding cell voltage of the cell j is $v_{t_1,j}$.

Example 1: P1_time is 1 hour, t_polarization is 2 hours, a time t0 at which a traction battery stops being charged is 13:00, a starting time of the first phase (a period 1) is selected as t1, t1 is 16:00, and t1−t0>2 indicates that selected t1 is a time point after depolarization is completed. If ti<t1+1, for example, ti is 16:30, a cell voltage of each corresponding cell in the traction battery within a time period from t1 to t1+1, for example, corresponding cell voltages of any cell j at various time points within a time period from 16:00 to 17:00, may be extracted for analysis. For example, $t_{t\_i,j}$ is 16:50, $t_{t\_1,j}$ is 16:00, a corresponding cell voltage $v_{t\_i,j}$ at 16:50 is 1, a cell voltage $v_{t\_1,j}$ at 16:00 is 1.01, and p1Sdr is 0.012.

Further, if calculated p1Sdr is greater than s1 (a first threshold), it is determined that there is a serious micro-internal short circuit in the cell j. Therefore, the traction battery where the cell j is located has a relatively high risk of internal short circuit, cannot be directly allocated to an electric vehicle for use and needs to be retained, and requires a second phase of self-discharge observation and calculation. However, if the calculated p1Sdr is not greater than the first threshold s1, for example, if p1Sdr≤s1, it is determined that there is no micro-internal short circuit in the cell j. Therefore, the traction battery where the cell j is located has a relatively low risk of internal short circuit belonging to the normal range, and may be normally swapped for use by an electric vehicle when needed. A value range of s1 may be 0.1 to 100. Example 1 is still used: p1Sdr is 0.012, s1 is 0.2, and 0.012<s1. In this case, the battery is allowed for normal exchange. If p1Sdr is 0.3, and 0.3>s1, a period 2 is triggered. In other words, if cell voltages of all cells in a traction battery do not indicate p1Sdr>s1 in the first phase of self-discharge observation and calculation (the period 1), the second phase of self-discharge observation and calculation is not triggered; or, if a cell voltage of any cell in the traction battery indicates p1Sdr>s1 in the period 1, it is considered that there is a micro-internal short circuit in the traction battery, which is highly risky, and the second phase of self-discharge observation and calculation (the period 2) is triggered.

Further, after completing the observation and the calculation, the cloud may feed back a result (including a case where the battery is normal and a case where the battery is retained for further observation in a next phase) to each battery swap station.

(b) If ti>t1+P1_time, the self-discharge rate p1Sdr within the duration P1_time is calculated by using the sliding window method. For example, the observation and the calculation are performed on cell voltages within the time period from ti to ti+P1_time. The first-phase self-discharge rate p1Sdr is calculated according to formula 3:

$$p1Sdr = \left| \frac{v_{t_i,j} - v_{t_i-P1_{time},j}}{t_{t_i,j} - t_{t_i-P1_{time},j}} \right|. \quad \text{Formula 3}$$

Herein, ti>t1+P1_time, ti represents a time point at which the first phase of voltage self-discharge observation ends and is a time point in the past, and the time period from t1 to ti for observation is beyond the duration P1_time of the first phase of self-discharge observation and calculation, that is, longer than the duration of the first phase. In this case, the sliding window is slid through the moment t1 to select voltages within the time period from ti to ti+P1_time for analysis.

$t_{t_i,j}$ represents a time point (moment) ti that is selected from the time period from ti to ti+P1_time for the observation of a cell voltage of the cell j, and in this case, the corresponding voltage of the cell j is $v_{t_i,j}$; and $t_{t_i-P1\_time,j}$ represents the time point (moment) $t_i$−P1_time, earlier than $t_{t_i,j}$, that is selected from the time period from ti to ti+P1_time as a starting time for the observation of a cell voltage of the cell j, and in this case, the corresponding cell voltage of the cell j is $v_{t_i-P1\_time,j}$. Example 2: P1_time is 1 hour, t_polarization is 2 hours, a time t0 at which a traction battery stops being charged is 13:00, a starting time of the first phase (a period 1) is selected as t1, t1 is 16:00, and t1−t0>2 indicates that selected t1 is a time point after depolarization is completed. If ti>t1+1, for example, when ti is 17:10, a cell voltage of each corresponding cell in the traction battery within a time period from ti to ti+1, for example, corresponding cell voltages of any cell j in the traction battery at various time points within a time period from 17:30 to 18:30, may be extracted for analysis. For example, $t_{t\_i,j}$ is 18:30, $t_{t_i-P1\_time,j}$ is 17:40, a corresponding cell voltage $v_{t\_i,j}$ at 18:30 is 1, a cell voltage $v_{t_i-P1\_time,j}$ at 17:40 is 1.3, and p1Sdr is 0.36.

Further, if calculated p1Sdr is greater than s1 (a first threshold), it is determined that there is a serious micro-internal short circuit in the cell j. Therefore, the traction battery where the cell j is located has a relatively high risk of internal short circuit, cannot be directly allocated to an electric vehicle for use and needs to be retained, and requires a second phase of self-discharge observation and calculation. If the calculated p1Sdr is not greater than the first threshold s1, for example, if p1Sdr≤s1, it is determined that there is no micro-internal short circuit in the cell j. Therefore, the traction battery where the cell j is located has a relatively low risk of internal short circuit belonging to the normal range, and may be normally swapped for use by an electric vehicle when needed. A value range of s1 may be 0.1 to 100. Example 2 is still used: p1Sdr is 0.36, s1 is 0.2, and 0.36>s1. In this case, the period 2 is triggered. If p1Sdr is 0.1, and 0.1<s1, the battery is allowed for normal exchange. In other words, if cell voltages of all cells in a traction battery do not indicate p1Sdr>s1 in the first phase of self-discharge observation and calculation (the period 1), the second phase of self-discharge observation and calculation is not triggered; or, if a cell voltage of any cell in the traction battery indicates p1Sdr>s1 in the period 1, it is considered that there is a micro-internal short circuit in the traction battery, which is highly risky, and the second phase of self-discharge observation and calculation (the period 2) is triggered.

Further, after completing the observation and the calculation, the cloud may feed back a result (including a case where the battery is normal and a case where the battery is retained for further observation in a next phase) to each battery swap station.

The sliding window calculation method used in (b) can help to accurately calculate a trend change of a monotonic change curve, which saves computing resources on the cloud, and improves computing efficiency.

Still further, a self-discharge rate sdr of a traction battery may be calculated by using a linear fitting method to replace a calculation manner in each phase. In other words, the linear fitting method is used for calculation in the period 1. For example, in the linear fitting method, a linear fitting calculation is performed on cell voltages of any cell j of all cells in a traction battery that are obtained within a specific time period, and a slope is used as the self-discharge rate sdr1, that is, sdr1=k. A linear fitting formula is as shown in formula 5:

$$v\hat{}=v_0+kt_i \qquad \text{Formula 5,}$$

where $v\hat{}$ represents all the voltages of the cell j within the specific time period, $v_0$ represents an initial voltage at a starting time of this period, and $t_i$ represents an ending time point of this period. Similarly, a result of k, namely, the self-discharge rate sdr1, may be compared with s1. For example, in the period 1, the calculated self-discharge rate sdr1 is greater than s1, and in this case, the traction battery requires further observation in the second phase, namely the period 2; or, if the calculated self-discharge rate sdr1 is not greater than s1, there is no voltage change in the cell, that is, the self-discharge rate sdr1 is not greater than s1, and in this case, the traction battery is allowed for normal exchange.

The phased-calculation apparatus 620 further includes a second-phase calculation apparatus 6204 configured to: when it is determined that the traction battery where the cell is located requires the second phase of self-discharge observation and calculation, select a time, with duration (P2_time) greater than that of the first phase of self-discharge observation and calculation after the first phase of self-discharge observation and calculation is completed, as a starting time of the second phase of self-discharge observation and calculation on the cell voltage of each cell in the traction battery to obtain a second-phase self-discharge rate (p2Sdr) of each cell, so as to determine whether there is an internal short circuit in the traction battery where the cell is located.

Specifically, the second phase of self-discharge observation and calculation (the period 2) is required for a traction battery that is determined as having a high risk of internal short circuit in the period 1. A time point after completion of the first phase for the traction battery where the cell is located, for example, t2 or t3 shown in FIG. 2, is selected as the starting time of the second phase. In addition, a manner of obtaining the self-discharge rate p2Sdr in the second phase of self-discharge observation and calculation is similar to that in the first phase. In an example, the duration P2_time may be set to n times as long as P1_time, and a value of n ranges from 2 to 10. In this phase, the second-phase self-discharge rate p2Sdr is observed and calculated according to formula 4:

$$p2Sdr = \left| \frac{v_{i+P2_{time},j} - v_{i,j}}{t_{i+P2_{time},j} - t_{i,j}} \right|, \qquad \text{Formula 4}$$

where $t_{i+P2\_time}$ represents a time point (moment) $t_{i+P2\_time}$ that is selected from the time period from the moment ti after the second phase starts to ti+P2_time for observation of a cell voltage of the cell j, and in this case, the corresponding voltage of the cell j is $v_{i+P2\_time}$; and $t_{i,j}$ represents a time point (moment) $t_i$, earlier than $t_{i+P2\_time}$, that is selected from the time period from the moment ti after the second phase starts to ti+P2_time as a starting time for the observation of a cell voltage of the cell j, and in this case, the corresponding cell voltage of the cell j is $v_{i,j}$. For an example of calculation, refer to Example 1 or Example 2 in (a) or (b).

Further, if calculated p2Sdr is greater than s2 (a second threshold), it is determined that there is a serious micro-internal short circuit in the cell j. Therefore, the traction battery where the cell j is located has a relatively high risk of internal short circuit and cannot be directly allocated to an electric vehicle for use, and it is determined to trigger subsequent handling for the traction battery such as giving an alarm, stopping usage of the traction battery, and initiating a return and repair process. If the calculated p2Sdr is not greater than the second threshold s2, for example, p2Sdr≤s2, it is determined that there is no micro-internal short circuit in the cell j. When all cells in the traction battery where the cell j is located do not indicate p2Sdr>s2, it indicates that the traction battery has a relatively low risk of internal short circuit belonging to a normal range, and may be normally swapped for use by an electric vehicle when needed. A value range of s2 may be 0.1 to 100.

It may be preset that s1 is greater than s2 that is greater than a specific value of a self-discharge rate of a cell.

Still further, a second-phase self-discharge rate sdr2 of a traction battery may be calculated by using a linear fitting method to replace a calculation method in each phase. In other words, the linear fitting method is used for calculation in the second phase. For example, in the linear fitting method, a linear fitting calculation is performed on all voltages of a cell j in a traction battery that are obtained within a specific time period, and a slope is used as the self-discharge rate sdr2, that is, sdr2=k. A linear fitting formula is as shown in formula 5:

$$v\hat{}=v_0+kt_i \qquad \text{Formula 5,}$$

where $v\hat{}$ represents all the voltages of the cell j within the specific time period, $v_0$ represents an initial voltage at a starting time of this period, and $t_i$ represents an ending time point of this period. Similarly, a result of k, namely the self-discharge rate sdr2, may be compared with s2. For example, if sdr2 calculated in the second phase is greater than s2, subsequent handling such as giving an alarm is triggered; or if sdr2 is not greater than s2, it indicates that the traction battery is normal.

Through designs such as the multi-phase design and the sliding window method and calculations, computing resources, operational resources, and the like are saved. Further, the self-discharge calculation is performed in a shorter observation period 1 and a longer observation period 2, and observation in the period 2 is triggered by a result indicated in the period 1, such that some traction batteries having a relatively high risk are retained, thereby ensuring calculation accuracy without affecting battery exchange and operation of a whole battery swap station, that is, taking operation of the battery swap station into account.

The system further includes an alarm apparatus 630 configured to trigger, based on determination that there is an internal short circuit in the traction battery where the cell is located, safety handling for the traction battery.

Specifically, for example, after completing the observation and the calculation, the cloud may feed back a result to each battery swap station. In a case where a traction battery has a risk of internal short circuit, as shown in FIG. 1, a server on the cloud feeds back a result to each battery swap station after completing the calculation, to trigger subsequent handling for one or more corresponding traction batteries in each battery swap station, namely the safety handling for the traction batteries, where the safety handling includes giving an alarm, stopping usage of the traction battery, and initiating a return and repair process. An alarm may be given in a manner of outputting alarm information or providing various alarm sounds and optical and/or electrical signals.

In another embodiment in the disclosure, an internal short circuit monitoring and calculation system on the cloud for a traction battery may alternatively be disposed in a local control device of each battery swap station.

According to the disclosure, a scenario where a traction battery is stored statically in a battery swap station rather than a complex environment of an electric vehicle-side is used. Therefore, a simpler environment is implemented based on the changed scenario, data within a longer time period can be collected more easily, and the collected data is accurate and stable. A more accurate result can be obtained by calculation, based on larger amounts of more accurate data in a static working condition in a battery swap station having uncomplicated influences, on the cloud capable of calculating and storing huge amounts of historical data, and a higher success rate of determination is achieved with higher accuracy. During the calculation, phased retaining triggering, the sliding window method, and the like are used, which can considerably save computing resources and improve efficiency.

Based on the embodiments of the method, the disclosure further provides an embodiment of a storage apparatus. In the embodiment of the storage apparatus, the storage apparatus stores a plurality of pieces of program codes, and the program codes are adapted to be loaded and run by a processor to perform the foregoing method. For ease of description, only parts related to the embodiments of the disclosure are shown. For specific technical details that are not disclosed, reference may be made to the method part of the embodiments of the disclosure.

Based on the embodiments of the method, the disclosure further provides an embodiment of a control apparatus. In the embodiment of the control apparatus, the apparatus includes a processor and a storage apparatus, where the storage apparatus stores a plurality of pieces of program codes, and the program codes are adapted to be loaded and run by the processor to perform the foregoing method. For ease of description, only parts related to the embodiments of the disclosure are shown. For specific technical details that are not disclosed, reference may be made to the method part of the embodiments of the disclosure.

In the various embodiments of the disclosure, a micro-internal short circuit in a traction battery is monitored and determined. Preferably, based on a stable environment of a battery swap station, with fewer influencing factors, where traction batteries are stored, a huge amount of electrical signal information of all cells in a traction battery is collected and stored in chronological order. Based on the huge amount of stable, accurate and long-term historical data collected in a static working condition, observation of a cell in the traction battery is performed stepwise in phases to calculate a self-discharge rate. Through a comparison between the self-discharge rate and a threshold, whether there is an internal short circuit in the traction battery where the cell is located is determined. Therefore, a more accurate calculation result can be obtained, and a high success rate of determination is achieved. Further, the phased and stepwise observation and calculation are mainly performed in a first phase and a second phase, and a sliding window calculation method is used in some steps. Once a self-discharge rate of a cell in a traction battery calculated in the first phase exceeds a threshold, that is, is greater than a first threshold, the traction battery has to be retained and requires the second phase of observation and calculation. After the second phase of observation and calculation is completed, whether a self-discharge rate calculated in the second phase exceeds a second threshold is determined. If the self-discharge rate exceeds the second threshold, it is considered that there is a relatively great risk of internal short circuit, and an alarm is given for safety handling of the traction battery. Or, in either of a case where the self-discharge rate calculated in the first phase does not exceed the first threshold or a case where the self-discharge rate calculated in the second phase does not exceed the second threshold, it may be considered that the traction battery has no risk of internal short circuit and is allowed for normal exchange. In this way, both calculation accuracy and operational efficiency of a battery swap station can be taken into account. In addition, the sliding window method can help to accurately calculate a trend change of a monotonic variation curve, thereby saving computing resources, and improving computing efficiency. Therefore, real-time monitoring of an internal short circuit in a traction battery is implemented efficiently and accurately by taking an environment of a battery swap station as a basic environment.

Those skilled in the art can understand that all or some of the procedures in the method of the foregoing embodiment of the disclosure may also be implemented by a computer program instructing relevant hardware. The computer program may be stored in a computer-readable storage medium, and when the computer program is executed by a processor, the steps of the foregoing method embodiments can be implemented. The computer program includes computer program code, which may be in a source code form, an object code form, an executable file form, some intermediate forms, or the like. The computer-readable medium may include: any entity or apparatus that can carry the computer program code, such as a medium, a USB flash drive, a removable hard disk, a magnetic disk, an optical disc, a computer memory, a read-only memory, a random access memory, an electrical carrier signal, a telecommunications signal, and a software distribution medium. It should be noted that the content included in the computer-readable medium may be appropriately added or deleted depending on requirements of the legislation and patent practice in a jurisdiction. For example, in some jurisdictions, according to the legislation and patent practice, the computer-readable medium does not include an electrical carrier signal and a telecommunications signal.

Further, it should be understood that, since the configuration of the modules is merely intended to illustrate functional units of a system of the disclosure, a physical device corresponding to these modules may be a processor itself, or part of software, part of hardware, or part of a combination of software and hardware in the processor. Therefore, the number of modules in the figure is merely illustrative.

Those skilled in the art can understand that the modules in the system may be adaptively split or combined. Such a split or combination of specific modules does not cause the technical solutions to depart from the principle of the disclosure. Therefore, technical solutions after any such split or combination shall all fall within the scope of protection of the disclosure.

Heretofore, the technical solutions of the disclosure have been described with reference to an implementation shown in the accompanying drawings. However, it would have been readily understood by those skilled in the art that the scope of protection of the disclosure is obviously not limited to these specific implementations. Those skilled in the art can make equivalent changes or substitutions to the related technical features without departing from the principle of the disclosure, and all the technical solutions with such changes or substitutions shall fall within the scope of protection of the disclosure.

What is claimed is:

1. A method for monitoring a battery short circuit, comprising:
   receiving collected electrical signal information of all cells in each traction battery;
   performing self-discharge observation and calculating a self-discharge rate based on a cell voltage in electrical signal information of each cell after depolarization is completed, to determine whether there is an internal short circuit in a traction battery where the cell corresponding to the self-discharge rate is located; and
   triggering alarm handling for the internal short circuit in the traction battery based on a back-fed result that there is an internal short circuit in the traction battery;
   wherein the receiving collected electrical signal information of all cells in each traction battery specifically comprises:
   in a case where the traction battery remains stationary in a battery swap station for a long time, collecting in real time, by a battery swap station-side, the electrical signal information of all the cells in each traction battery stored in the battery swap station, wherein the real-time collection comprises: collecting the electrical signal information of all the cells in each traction battery during charging and after charging is completed in a case where the traction battery remains stationary in the battery swap station,
   wherein the electrical signal information of each cell at least comprises: a single-cell voltage, a current, a temperature, and a state of charge (SOC);
   uploading, by the battery swap station-side, the collected electrical signal information of all the cells in the traction battery synchronously to the cloud or a local control device of the battery swap station; and
   receiving, on the cloud or by the local control device of the battery swap station, the electrical signal information and storing the information based on a collection time at which the information is collected in real time.

2. The method according to claim 1, wherein the performing self-discharge observation and calculating a self-discharge rate based on a cell voltage in electrical signal information of each cell after depolarization is completed, to determine whether there is an internal short circuit in a traction battery where the cell corresponding to the self-discharge rate is located specifically comprises:
   determining, based on the collection time of the electrical signal information of each cell, a time at which the traction battery where the cell is located stops being charged;
   selecting, based on the time at which the traction battery stops being charged and depolarization duration corresponding to a type of the traction battery, a starting time of a first phase of self-discharge observation and calculation on the cell voltage of each cell in the traction battery;
   performing the first phase of self-discharge observation and calculation on the cell voltage of each cell in the traction battery from the starting time, to obtain a first-phase self-discharge rate of the cell;
   determining, based on the first-phase self-discharge rate of each cell, whether to perform a second phase of self-discharge observation and calculation for the traction battery where the cell is located;
   starting to perform, if the determination is yes after the first phase of self-discharge observation and calculation is completed, the second phase of self-discharge observation and calculation on the cell voltage of each cell in the traction battery with duration greater than that of the first phase of self-discharge observation and calculation, to obtain a second-phase self-discharge rate of each cell; and
   determining, based on the second-phase self-discharge rate of each cell, whether there is an internal short circuit in the traction battery where the cell is located.

3. The method according to claim 2, wherein
   the determining, based on the collection time of the electrical signal information of each cell, a time at which the traction battery where the cell is located stops being charged specifically comprises:
   selecting, from the electrical signal information based on a sequence of the collection time corresponding to all the cells in the traction battery, a time at which currents of all the cells are 0 as the time at which the charging stops; and
   the selecting, based on the time at which the traction battery stops being charged and depolarization duration corresponding to a type of the traction battery, a starting time of a first phase of self-discharge observation and calculation on the cell voltage of each cell in the traction battery specifically comprises:
   determining, through tests, depolarization duration corresponding to the type of each traction battery; and
   selecting, as the starting time of the first phase of self-discharge observation and calculation on the cell voltage of each cell in the traction battery after the depolarization is completed, a time point with duration greater than a sum of the time at which the charging stops and the depolarization duration.

4. The method according to claim 3, wherein the performing the first phase of self-discharge observation and calculation on the cell voltage of each cell in the traction battery from the starting time, to obtain a first-phase self-discharge rate of the cell specifically comprises:
   calculating a first-phase self-discharge rate p1Sdr1 of the observed $j^{th}$ cell within duration P1_time of the first phase of self-discharge observation and calculation:

$$p1Sdr = \left| \frac{v_{i,j} - v_{1,j}}{t_{i,j} - t_{1,j}} \right|, \quad \text{Formula 1}$$

wherein $v_{i,j}$ represents a cell voltage of the $j^{th}$ cell at a moment ti, $v_{1,j}$ represents a cell voltage of the $j^{th}$ cell at a moment t1, $t_{i,j}$ represents the moment ti related to the $j^{th}$ cell, and $t_{1,j}$ represents the moment t1, before $t_{i,j}$, related to the $j^{th}$ cell.

5. The method according to claim 4, wherein the calculating a first-phase self-discharge rate p1Sdr1 of the observed $j^{th}$ cell within duration P1_time of the first phase of self-discharge observation and calculation specifically comprises:
   if the time point ti at which the observation ends is less than a sum of the time point t1 at which the observation starts and P1_time, selecting a cell voltage of the $j^{th}$ cell within the time period from t1 to t1+P1_time for observation, and calculating a first-phase self-discharge rate p1Sdr of the $j^{th}$ cell:

$$p1Sdr = \left| \frac{v_{t_i,j} - v_{t_1,j}}{t_{t_i,j} - t_{t_1,j}} \right|, \quad \text{Formula 2}$$

wherein $t_{t_i,j}$ represents the moment ti that is selected from the time period from t1 to t1+P1_time for the observation of a cell voltage of the $j^{th}$ cell, and in this case, the corresponding voltage of the $j^{th}$ cell is $v_{t_i,j}$; and $t_{t_1,j}$ represents the moment t1, earlier than $t_{t_i,j}$, that is selected from the time period from t1 to t1+P1_time as a starting time for the observation of a cell voltage of the $j^{th}$ cell, and in this case, the corresponding cell voltage of the $j^{th}$ cell is $v_{t_1,j}$; or
   if the time point ti at which the observation ends is greater than the sum of the time point t1 at which the observation starts and P1_time, selecting a cell voltage of the $j^{th}$ cell within the time period from ti to ti+P1_time for observation, and calculating the first-phase self-discharge rate p1Sdr of the $j^{th}$ cell:

$$p1Sdr = \left| \frac{v_{t_i,j} - v_{t_i-P1_{time},j}}{t_{t_i,j} - t_{t_i-P1_{time},j}} \right|, \quad \text{Formula 3}$$

wherein $t_{t_i,j}$ represents the moment ti selected from the time period from ti to ti+P1_time for the observation of a cell voltage of the $j^{th}$ cell, and in this case, the corresponding cell voltage of the $j^{th}$ cell is $v_{t_i,j}$; and $t_{t_i-P1_{time},j}$ represents a moment $t_i$–P1_time, earlier than $t_{t_i,j}$, that is selected from the time period from ti to ti+P1_time as a starting time for the observation of a cell voltage of the $j^{th}$ cell, and in this case, the corresponding cell voltage of the $j^{th}$ cell is $v_{t_i-P1_{time},j}$.

6. The method according to claim 4, wherein the determining, based on the first-phase self-discharge rate of each cell, whether to perform a second phase of self-discharge observation and calculation for the traction battery where the cell is located specifically comprises:
   comparing the first-phase self-discharge rate p1Sdr or sdr1 of each cell with a first threshold s1;
   when the first-phase self-discharge rate p1Sdr of the cell is greater than the first threshold s1 or sdr1 is greater than the first threshold s1, determining that the traction battery where the cell is located requires the second phase of self-discharge observation and calculation; and
   when the first-phase self-discharge rate p1Sdr of the cell is less than or equal to the first threshold s1 or sdr1 is less than or equal to the first threshold s1, determining that the traction battery where the cell is located has no risk of internal short circuit and is allowed for normal exchange.

7. The method according to claim 6, wherein the starting to perform, if the determination is yes after the first phase of self-discharge observation and calculation is completed, a second phase of self-discharge observation and calculation on the cell voltage of each cell in the traction battery with duration greater than that of the first phase of self-discharge observation and calculation, to obtain a second-phase self-discharge rate of each cell specifically comprises:
   performing, after the first phase of self-discharge observation and calculation is completed, the second phase of self-discharge observation and calculation on the cell voltage of each cell in the traction battery that requires the second phase of self-discharge observation and calculation, wherein a self-discharge rate p2Sdr of the $j^{th}$ cell within duration P2_time of the second phase of self-discharge observation and calculation is calculated:

$$p2Sdr = \left| \frac{v_{i+P2_{time},j} - v_{i,j}}{t_{i+P2_{time},j} - t_{i,j}} \right|, \quad \text{Formula 4}$$

wherein $t_{i+P2\_time,j}$ represents a moment $t_{i+P2\_time}$ that is selected from a time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i+P2\_time,j}$; and $t_{i,j}$ represents the moment $t_i$, earlier than $t_{i+P2\_time}$, that is selected from the time period from the moment ti to ti+P2_time for the observation of a cell voltage of the $j^{th}$ cell in the second phase of self-discharge observation and calculation, and in this case, the corresponding cell voltage of the $j^{th}$ cell is $v_{i,j}$,
   wherein the duration P2_time of the second phase of self-discharge observation and calculation is n times as long as the duration P1_time of the first phase of self-discharge observation and calculation, and n∈ [2, 10].

8. The method according to claim 7, wherein the determining, based on the second-phase self-discharge rate of each cell, whether there is an internal short circuit in the traction battery where the cell is located specifically comprises:
   comparing the second-phase self-discharge rate p2Sdr or sdr2 of each cell with a second threshold s2;
   when the second-phase self-discharge rate p2Sdr of the cell is greater than the second threshold s2 or sdr2 is greater than the second threshold s2, determining that there is an internal short circuit in the traction battery where the cell is located; and
   when the second-phase self-discharge rate p2Sdr of the cell is less than or equal to the second threshold s2 or sdr2 is less than or equal to the second threshold s2, determining that the traction battery where the cell is located has no risk of internal short circuit and is allowed for normal exchange,
   wherein the preset first threshold s1 is greater than the second threshold s2 that is greater than a specified value of a self-discharge rate of the cell, and a value range of s1 and s2 is 0.1 to 100.

9. The method according to claim 8, wherein the triggering alarm handling for the internal short circuit in the traction battery based on a back-fed result that there is an internal short circuit in the traction battery specifically comprises:
   feeding back, on the cloud or by the local control device of the battery swap station after each phase of observation and calculation is completed, a result about whether there is an internal short circuit in the traction battery to the corresponding battery swap station-side; and when the result received by the battery swap station is that there is an internal short circuit in the traction battery, triggering, by the battery swap station, alarm handling for the internal short circuit in the traction battery, wherein the alarm handing comprises: giving an alarm, stopping usage of the traction battery, and initiating a return and repair process.

10. The method according to claim 6, wherein the starting to perform, if the determination is yes after the first phase of self-discharge observation and calculation is completed, a second phase of self-discharge observation and calculation on the cell voltage of each cell in the traction battery with duration greater than that of the first phase of self-discharge observation and calculation, to obtain a second-phase self-discharge rate of each cell specifically comprises:

performing, after the first phase of self-discharge observation and calculation is completed, the second phase of self-discharge observation and calculation on the cell voltage of each cell in the traction battery that requires the second phase of self-discharge observation and calculation, and performing a linear fitting calculation on all the cell voltages of the $j^{th}$ cell within the duration P2_time of the second phase of self-discharge observation and calculation:

$$v\char`\^=v_0+kt_i \qquad \text{Formula 5,}$$

wherein $v\char`\^$ represents all voltages of the cell j within a specific time period, $v_0$ represents an initial voltage at a starting time of this period, $t_i$ represents an ending time point of this period, and a slope k is equal to a self-discharge rate sdr2.

11. The method according to claim 3, wherein the performing the first phase of self-discharge observation and calculation on the cell voltage of each cell in the traction battery from the starting time, to obtain a first-phase self-discharge rate of the cell specifically comprises:

performing a linear fitting calculation on all cell voltages of the $j^{th}$ cell within the duration P1_time of the first phase of self-discharge observation and calculation:

$$v\char`\^=v_0+kt_i \qquad \text{Formula 5,}$$

wherein $v\char`\^$ represents all voltages of the cell j within a specific time period, $v_0$ represents an initial voltage at a starting time of this period, $t_i$ represents an ending time point of this period, and a slope k is equal to a self-discharge rate sdr1.

12. A system for monitoring a battery short circuit, comprising:

a receiving and storage apparatus configured to receive collected electrical signal information of all cells in each traction battery;

a phased-calculation apparatus configured to perform self-discharge observation and calculate a self-discharge rate based on a cell voltage in electrical signal information of each cell after depolarization is completed, to determine whether there is an internal short circuit in a traction battery where the cell corresponding to the self-discharge rate is located; and an alarm apparatus configured to trigger alarm handling for the internal short circuit in the traction battery based on a back-fed result that there is an internal short circuit in the traction battery;

wherein the receiving and storage apparatus specifically comprises:

in a case where the traction battery remains stationary in a battery swap station for a long time, collecting in real time, by a battery swap station-side, the electrical signal information of all the cells in each traction battery stored in the battery swap station, wherein the real-time collection comprises: collecting the electrical signal information of all the cells in each traction battery during charging and after charging is completed in a case where the traction battery remains stationary in the battery swap station, wherein the electrical signal information of each cell at least comprises: a single-cell voltage, a current, a temperature, and a state of charge (SOC);

uploading, by the battery swap station-side, the collected electrical signal information of all the cells in the traction battery synchronously to the cloud or a local control device of the battery swap station; and receiving, on the cloud or by the local control device of the battery swap station, the electrical signal information and storing the information based on a collection time at which the information is collected in real time.

13. The system according to claim 12, wherein the phased-calculation apparatus specifically comprises:

a charging stop time apparatus configured to determine, based on the collection time of the electrical signal information of each cell, a time at which the traction battery where the cell is located stops being charged;

a first-phase start selection apparatus configured to select, based on the time at which the traction battery stops being charged and depolarization duration corresponding to a type of the traction battery, a starting time of a first phase of self-discharge observation and calculation on the cell voltage of each cell in the traction battery;

a first-phase calculation apparatus configured to perform the first phase of self-discharge observation and calculation on the cell voltage of each cell in the traction battery from the starting time, to obtain a first-phase self-discharge rate of the cell; and determining, based on the first-phase self-discharge rate of each cell, whether to perform a second phase of self-discharge observation and calculation for the traction battery where the cell is located;

a second-phase calculation apparatus configured to: start to perform, if the determination is yes after the first phase of self-discharge observation and calculation is completed, the second phase of self-discharge observation and calculation on the cell voltage of each cell in the traction battery with duration greater than that of the first phase of self-discharge observation and calculation, to obtain a second-phase self-discharge rate of each cell; and determining, based on the second-phase self-discharge rate of each cell, whether there is an internal short circuit in the traction battery where the cell is located.

14. The system according to claim 13, wherein the charging stop time apparatus specifically comprises: selecting, from the electrical signal information based on a sequence of the collection time corresponding to all the cells in the traction battery, a time at which currents of all the cells are 0 as the time at which the charging stops; and the first-phase start selection apparatus specifically comprises: determining, through tests, depolarization duration corresponding to the type of each traction battery;

and selecting, as the starting time of the first phase of self-discharge observation and calculation on the cell voltage of each cell in the traction battery after the depolarization is completed, a time point with duration greater than a sum of the time at which the charging stops and the depolarization duration.

15. The system according to claim 14, wherein the first-phase calculation apparatus specifically comprises:
calculating a first-phase self-discharge rate p1Sdr1 of the observed $j^{th}$ cell within duration P1_time of the first phase of self-discharge observation and calculation:

$$p1Sdr = \left| \frac{v_{i,j} - v_{1,j}}{t_{i,j} - t_{1,j}} \right|, \quad \text{Formula 1}$$

wherein $v_{i,j}$ represents a cell voltage of the $j^{th}$ cell at a moment ti, $v_{1,j}$ represents a cell voltage of the $j^{th}$ cell at a moment t1, $t_{i,j}$ represents the moment ti related to the $j^{th}$ cell, and $t_{1,j}$ represents the moment t1, before $t_{i,j}$, related to the $j^{th}$ cell.

16. The system according to claim 15, wherein the first-phase calculation apparatus further comprises:
if the time point ti at which the observation ends is less than a sum of the time point t1 at which the observation starts and P1_time, selecting a cell voltage of the $j^{th}$ cell within the time period from t1 to t1+P1_time for observation, and calculating a first-phase self-discharge rate p1Sdr of the $j^{th}$ cell:

$$p1Sdr = \left| \frac{v_{t_i,j} - v_{t_1,j}}{t_{t_i,j} - t_{t_1,j}} \right|, \quad \text{Formula 2}$$

wherein $t_{t_i,j}$ represents the moment ti that is selected from the time period from t1 to t1+P1_time for the observation of a cell voltage of the $j^{th}$ cell, and in this case, the corresponding voltage of the $j^{th}$ cell is $v_{t_i,j}$; and $t_{t_1,j}$ represents the moment t1, earlier than $t_{t_i,j}$, that is selected from the time period from t1 to t1+P1_time as a starting time for the observation of a cell voltage of the $j^{th}$ cell, and in this case, the corresponding cell voltage of the $j^{th}$ cell is $v_{t_i,j}$; or if the time point ti at which the observation ends is greater than the sum of the time point t1 at which the observation starts and P1_time, selecting a cell voltage of the $j^{th}$ cell within the time period from ti to ti+P1_time for observation, and calculating the first-phase self-discharge rate p1Sdr of the $j^{th}$ cell:

$$p1Sdr = \left| \frac{v_{t_i,j} - v_{t_i-P1_{time},j}}{t_{t_i,j} - t_{t_i-P1_{time},j}} \right|, \quad \text{Formula 3}$$

wherein $t_{t_i,j}$ represents the moment ti selected from the time period from ti to ti+P1_time for the observation of a cell voltage of the $j^{th}$ cell, and in this case, the corresponding cell voltage of the $j^{th}$ cell is $v_{t_i,j}$; and $t_{t_i-P1\_time,j}$ represents a moment ti−P1_time, earlier than $t_{t_i,j}$, that is selected from the time period from ti to ti+P1_time as a starting time for the observation of a cell voltage of the $j^{th}$ cell, and in this case, the corresponding cell voltage of the $j^{th}$ cell is $v_{t_i-P1\_time,j}$.

17. The system according to claim 15, wherein the first-phase calculation apparatus specifically comprises:
comparing the first-phase self-discharge rate p1Sdr or sdr1 of each cell with a first threshold s1;
when the first-phase self-discharge rate p1 Sdr of the cell is greater than the first threshold s1 or sdr1 is greater than the first threshold s1, determining that the traction battery where the cell is located requires the second phase of self-discharge observation and calculation; and
when the first-phase self-discharge rate p1 Sdr of the cell is less than or equal to the first threshold s1 or sdr1 is less than or equal to the first threshold s1, determining that the traction battery where the cell is located has no risk of internal short circuit and is allowed for normal exchange.

18. The system according to claim 14, wherein the first-phase calculation apparatus specifically comprises:
performing a linear fitting calculation on all cell voltages of the $j^{th}$ cell within the duration P1_time of the first phase of self-discharge observation and calculation:

$$v\hat{} = v_0 + kt_i \quad \text{Formula 5,}$$

wherein v^ represents all voltages of the cell j within a specific time period, v0 represents an initial voltage at a starting time of this period, ti represents an ending time point of this period, and a slope k is equal to a self-discharge rate sdr1.

* * * * *